United States Patent
Lee et al.

(10) Patent No.: US 9,559,002 B2
(45) Date of Patent: Jan. 31, 2017

(54) METHODS OF FABRICATING SEMICONDUCTOR DEVICES WITH BLOCKING LAYER PATTERNS

(71) Applicant: Samsung Electronics Co., Ltd., Suwon-si, Gyeonggi-do (KR)

(72) Inventors: Seung-Taek Lee, Bucheon-si (KR); Eun-Ji Kim, Seoul (KR); Sin-Woo Kang, Suwon-si (KR); Yeong-Lyeol Park, Yongin-si (KR); Sung-Dong Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/804,831

(22) Filed: Jul. 21, 2015

(65) Prior Publication Data
US 2016/0020145 A1  Jan. 21, 2016

(30) Foreign Application Priority Data
Jul. 21, 2014  (KR) .................. 10-2014-0091907

(51) Int. Cl.
*H01L 21/768* (2006.01)
*H01L 21/308* (2006.01)
(Continued)

(52) U.S. Cl.
CPC ..... *H01L 21/76898* (2013.01); *H01L 21/3083* (2013.01); *H01L 21/31053* (2013.01);
(Continued)

(58) Field of Classification Search
CPC .................. H01L 21/76898; H01L 21/76807; H01L 21/3083; H01L 21/31053; H01L 21/762; H01L 21/823475; H01L 2224/73204; H01L 23/481; H01L 23/53238; H01L 25/0657; H01L 23/5226; H01L 21/76834
See application file for complete search history.

(56) References Cited

U.S. PATENT DOCUMENTS 7,838,997 B2  11/2010  Trezza
7,968,460 B2   6/2011  Kirby et al.
(Continued)

FOREIGN PATENT DOCUMENTS

JP  2013-197470 A   9/2013
KR  10-2011-0053790 A   5/2011

*Primary Examiner* — Savitr Mulpuri
(74) *Attorney, Agent, or Firm* — Myers Bigel, P.A.

(57) ABSTRACT

A semiconductor device includes a circuit device on a substrate and a first insulating interlayer on the substrate and covering the circuit device. An electrode structure extends through the first insulating interlayer and at least partially through the substrate. An etch-stop layer pattern is disposed on a sidewall of the electrode structure on a side of the first insulating layer opposite the substrate. A blocking layer pattern is disposed on the etch-stop layer pattern. The device further includes an interconnection structure including a via portion passing through the blocking layer pattern to contact the through electrode structure and a wiring portion on the via portion and having a different width than the via portion. The semiconductor device may further include a contact plug electrically connected to the circuit device through the first insulating interlayer. The contact plug and the through electrode structure may include different metals.

17 Claims, 17 Drawing Sheets

(51) Int. Cl.

| | |
|---|---|
| *H01L 21/3105* | (2006.01) |
| *H01L 21/762* | (2006.01) |
| *H01L 23/48* | (2006.01) |
| *H01L 25/065* | (2006.01) |
| *H01L 23/522* | (2006.01) |
| H01L 21/8234 | (2006.01) |
| H01L 23/532 | (2006.01) |

(52) U.S. Cl.
CPC ...... *H01L 21/762* (2013.01); *H01L 21/76807* (2013.01); *H01L 21/76834* (2013.01); *H01L 23/481* (2013.01); *H01L 23/5226* (2013.01); *H01L 25/0657* (2013.01); H01L 21/823475 (2013.01); H01L 21/823481 (2013.01); H01L 23/53238 (2013.01); H01L 2224/73204 (2013.01)

(56) References Cited

U.S. PATENT DOCUMENTS

| | | |
|---|---|---|
| 8,076,234 B1 | 12/2011 | Park et al. |
| 8,168,533 B2 | 5/2012 | Kuo |
| 8,378,462 B2 | 2/2013 | Matsumoto |
| 8,405,222 B2 | 3/2013 | Yu et al. |
| 8,450,856 B2 | 5/2013 | Kang et al. |
| 8,518,823 B2 | 8/2013 | Huang et al. |
| 8,603,911 B2 | 12/2013 | Huang et al. |
| 2008/0284006 A1* | 11/2008 | Hong ................ H01L 21/76816 257/734 |
| 2011/0291300 A1 | 12/2011 | Hirano et al. |
| 2013/0026648 A1 | 1/2013 | Hirano et al. |
| 2013/0200526 A1 | 8/2013 | Moon et al. |
| 2013/0252422 A1 | 9/2013 | Chiou et al. |

\* cited by examiner

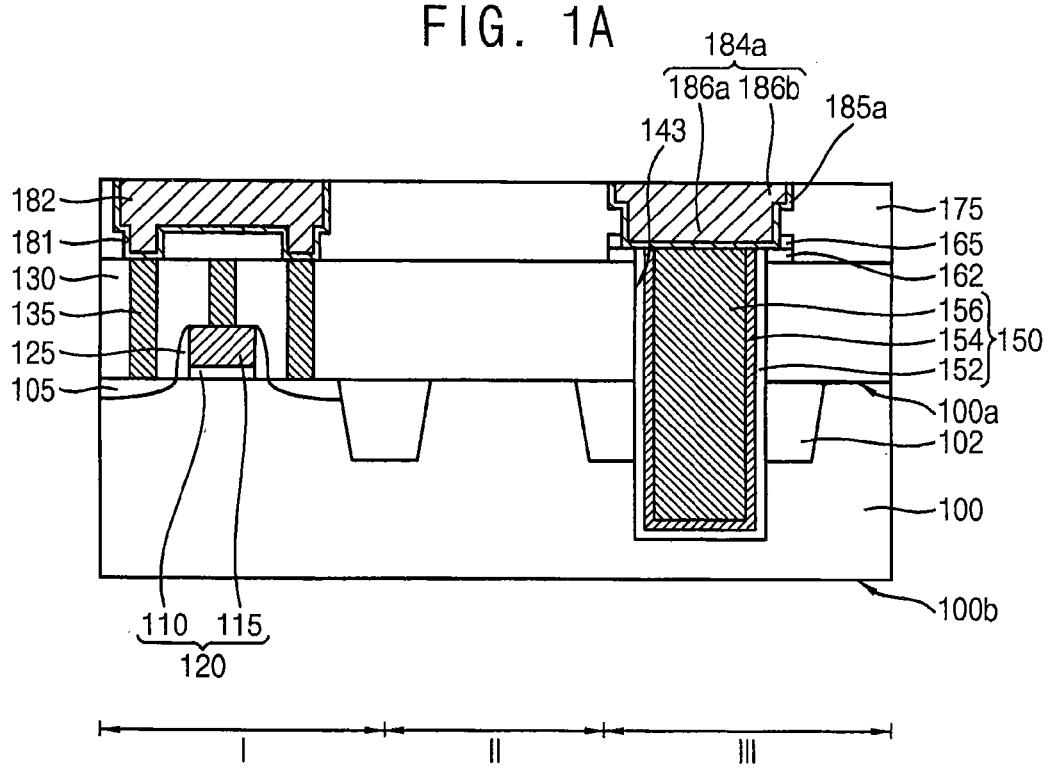
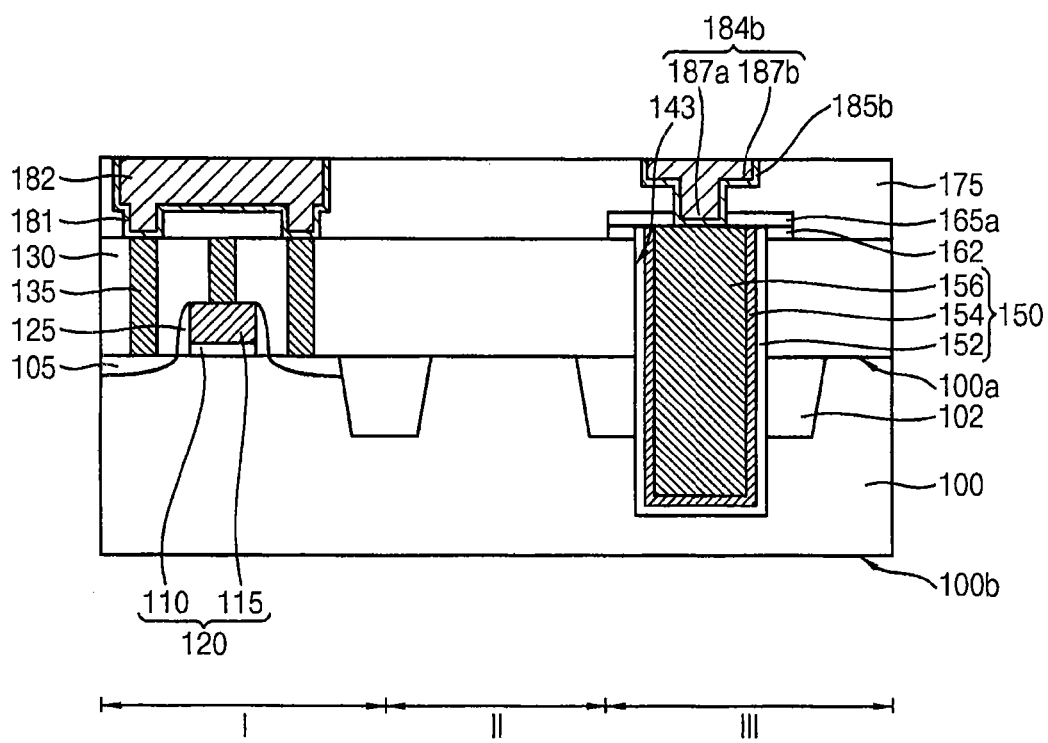

METHODS OF FABRICATING SEMICONDUCTOR DEVICES WITH BLOCKING LAYER PATTERNS

CROSS-REFERENCE TO RELATED APPLICATION

This application claims priority under 35 USC §119 to Korean Patent Application No. 10-2014-0091907, filed on Jul. 21, 2014 in the Korean Intellectual Property Office (KIPO), the contents of which are incorporated by reference herein in their entirety.

BACKGROUND

Embodiments of the inventive subject matter relate to semiconductor devices and methods of manufacturing the same and, more particularly, to semiconductor devices having through silicon vias and methods of manufacturing the same.

As the degree of integration of semiconductor devices has increased, new packaging technologies have been developed for mounting a plurality of individual chips. Such packaging technologies may include formation of a through electrode, such as a through silicon via (TSV), which may be formed through a semiconductor substrate. Such a technique may decrease the space needed to mount chips.

After the formation of the through electrode, a pre-treatment including a polish process or a cleaning process may be performed before forming wiring electrically connected to a circuit device and the through electrode. Reliability of the through electrode or the circuit device may be reduced by the pre-treatment.

SUMMARY

Some example embodiments provide a method of fabricating a semiconductor device having improved electrical property and reliability.

Some example embodiments provide a semiconductor device having improved electrical property and reliability.

Some example embodiments provide a method of fabricating a semiconductor device which comprises forming a circuit device on a substrate, forming a first insulating interlayer on the substrate and covering the circuit device, forming an etch-stop layer on the first insulating interlayer, forming a through electrode structure extending through the etch-stop layer and the first insulating interlayer and at least partially through the substrate, forming a blocking layer on the etch-stop layer and covering the through electrode structure, and removing portions of the blocking layer and the etch-stop layer to form an etch-stop layer pattern on the first insulating layer and a blocking layer pattern on the etch-stop layer pattern, the etch-stop layer pattern surrounding a portion of the through electrode structure, the blocking layer pattern on the etch-stop layer pattern and covering the through electrode structure.

In some embodiments, the etch-stop layer pattern may have a circular ring shape or a polygonal ring shape, and the blocking layer pattern may have a circular tile shape or a polygonal tile shape.

In some embodiments, a contact plug passing at least partially through the first insulating interlayer to be electrically connected to the circuit device may be further formed.

In some embodiments, the contact plug may be formed of a metal different from that of the through electrode structure.

The contact plug may be formed of tungsten (W) and the through electrode structure may be formed of copper (Cu).

In some embodiments, a top surface of the contact plug may be exposed by removing the portions of the blocking layer and the etch-stop layer.

In some embodiments, the method may further comprise forming a second insulating interlayer on the first insulating interlayer and covering the etch-stop layer pattern and the blocking layer pattern, removing portions of the second insulating interlayer and the blocking layer pattern to form first and second openings exposing the contact plug and the through electrode structure, respectively, and forming a wiring structure and an interconnection structure in respective ones of the first opening and the second opening and electrically connected to respective ones of the contact plug and the through electrode structure.

In some embodiments, the blocking layer pattern may be converted into a ring surrounding a portion of the interconnection structure. The first and second openings may be formed by a double damascene process. A passivation layer may be further formed on the first insulating interlayer to cover the contact plug and the blocking layer pattern before forming the second insulating interlayer. An upper portion of the passivation layer may be planarized such that the blocking layer pattern may be exposed. The first opening may extend through the second insulating interlayer and the passivation layer to expose the contact plug, and the second opening may extend through the second insulating interlayer and the blocking layer pattern to expose the through electrode structure.

Some example embodiments provide a method of fabricating a semiconductor device which comprises forming an insulating interlayer on a substrate, forming an etch-stop layer on the insulating interlayer, forming an electrode extending through the etch-stop layer and the insulating interlayer and at least partially through the substrate, forming a blocking layer on the etch-stop layer and covering the electrode, and removing portions of the blocking layer and the etch-stop layer to form an etch-stop layer pattern on the insulating interlayer and covering a sidewall surface of a portion of the electrode protruding from the insulating interlayer and a blocking layer pattern on the etch-stop layer and covering a top surface of the electrode.

In some embodiments, forming the etch-stop layer on the insulating interlayer may be preceded by forming a conductive plug in the insulating interlayer. The conductive plug and the electrode may comprise dissimilar metals.

In some embodiments, the method may further comprise forming an upper insulating interlayer on the insulating interlayer and covering the blocking layer pattern, removing portions of the upper insulating interlayer and the blocking layer pattern to form a hole exposing the top surface of the electrode, and forming a conductive via in the hole.

In some embodiments, the hole may expose a top surface of the etch-stop layer pattern, and the conductive via may be wider than the electrode. In some embodiments, the hole may expose only a portion of the top surface of the electrode, and the conductive via may be narrower than the electrode.

Some example embodiments provide a method of fabricating a semiconductor device which comprises providing a substrate, forming an isolation layer in the substrate to define a device region, a buffer region and a via region, forming a circuit device on the device region of the substrate, forming an insulating interlayer covering the circuit device throughout the device region, the buffer region and the via region, forming an etch-stop layer on the insulating interlayer throughout the device region, the buffer region and the via region, forming an electrode extending through the etch-stop layer and the insulating interlayer and at least partially through the substrate on the via region, forming a blocking layer on the etch-stop layer and covering the electrode throughout the device region, the buffer region and the via region, and removing portions of the blocking layer and the etch-stop layer to form a blocking layer pattern covering the electrode and an etch-stop layer pattern surrounding a sidewall of an upper portion of the electrode on the via region.

In some embodiments, removing the portions of the blocking layer and the etch-stop layer may include forming a photoresist pattern on a portion of the blocking layer on the via region.

In some embodiments, the buffer region may have an area or a volume smaller than that of each of the device region and the via region.

According to some embodiments, a semiconductor device includes a circuit device on a substrate and a first insulating interlayer on the substrate and covering the circuit device. An through electrode structure extends through the first insulating interlayer and at least partially through the substrate. An etch-stop layer pattern is disposed on a sidewall of the electrode structure on a side of the first insulating layer opposite the substrate. A blocking layer pattern is disposed on the etch-stop layer pattern. The device further includes an interconnection structure including a via portion passing through the blocking layer pattern to contact the through electrode structure and a wiring portion on the via portion and having a different width than the via portion.

In some embodiments, the wiring portion may be wider than the via portion and the wiring portion and the via portion may be merged. In some embodiments, an area of a cross-section of the via portion parallel to the substrate may be greater than an area of a top surface of the through electrode structure, and the blocking layer pattern may comprise a ring formed on a peripheral portion of the etch-stop layer pattern. In some embodiments, an area of a cross-section of the via portion parallel to the substrate may be less than an area of a top surface of the through electrode structure, and the blocking layer pattern may comprise a ring that covers a top surface of the etch-stop layer pattern and a portion of a top surface of the through electrode structure.

In some embodiments, the semiconductor device may further include a contact plug electrically connected to the circuit device through the first insulating interlayer.

In some embodiments, the device may further include a second insulating interlayer on the first insulating interlayer and a wiring structure in the second insulating interlayer and electrically connected to the contact plug. The interconnection structure may extend at least partially through the second insulating interlayer. In some embodiments, the device may further include a passivation layer on a top surface of the first insulating interlayer, a sidewall of the etch-stop layer pattern and a sidewall of the blocking layer pattern. The wiring structure may extend through the passivation layer. The passivation layer may extend on to a top surface of the blocking layer pattern, and the interconnection structure may extend through the passivation layer.

In some embodiments, the contact plug and the through electrode structure may comprise different metals. In an embodiment, the contact plug may comprise tungsten (W) and the through electrode structure may include copper (Cu).

In some embodiments, sidewalls of the etch-stop layer pattern and the blocking layer pattern may be coplanar with each other.

In some embodiments, a portion of the through electrode structure may protrude from a top surface of the first insulating interlayer, and the etch-stop layer pattern may include a ring surrounding the protruding portion of the through electrode structure.

In some embodiments, the etch-stop layer pattern may include silicon nitride or silicon oxynitride, and the blocking layer pattern may include silicon nitride.

Some example embodiments provide a semiconductor device including a substrate, an insulating interlayer on the substrate, an etch-stop layer pattern on the insulating interlayer, an electrode extending from the substrate through the insulating interlayer and having a portion protruding from the insulating interlayer and into the etch stop layer pattern, a blocking layer pattern on the etch-stop layer pattern, and a conductive via passing through the blocking layer pattern to contact the electrode.

In some embodiments, the conductive via may be wider than the electrode and the etch-stop layer pattern may underlie a portion of the conductive via. In some embodiments, the conductive via may be narrower than the electrode and the blocking layer pattern may overlie a portion of the electrode.

In some embodiments, the device may further include a contact plug in the insulating interlayer, and the contact plug and the electrode may include dissimilar metals.

In some embodiments, the insulating interlayer may comprise a first insulating interlayer, and the device may further comprise a second insulating interlayer on the first insulating interlayer, and a conductive wiring disposed on the conductive via in the second insulating interlayer, and the conductive via may be disposed in the second insulating interlayer.

Some example embodiments provide a semiconductor device comprising a substrate including a device region, a buffer region and a via region, a circuit device disposed on the device region of the substrate, a through electrode structure disposed on the via region of the substrate and extending through at least a portion of the substrate, an etch-stop layer pattern surrounding a sidewall of an upper portion of the through electrode structure, a blocking layer pattern on the etch-stop layer pattern, a top surface of the through electrode structure being exposed through the blocking layer pattern.

In some embodiments, the circuit device may not be disposed on the buffer region of the substrate, and the buffer region may have an area or a volume smaller than that of each of the device region and the via region.

BRIEF DESCRIPTION OF THE DRAWINGS

Example embodiments will be more clearly understood from the following detailed description taken in conjunction with the accompanying drawings. FIGS. 1A and 1B, and FIGS. 2 to 31 represent non-limiting, example embodiments as described herein.

FIGS. 1A and 1B are cross-sectional views illustrating semiconductor devices in accordance with some example embodiments;

FIGS. 2 to 13, FIGS. 14A and 14B, and FIGS. 15A and 15B are cross-sectional views and top plan views illustrating operations for manufacturing a semiconductor device in accordance with some example embodiments;

FIGS. 17 to 20 are cross-sectional views illustrating operations for manufacturing a semiconductor device in accordance with some example embodiments;

FIG. 21 is a cross-sectional view illustrating a semiconductor device in accordance with some example embodiments;

FIGS. 22 to 25 are cross-sectional views illustrating operations for manufacturing a semiconductor device in accordance with some example embodiments;

FIG. 26 is a cross-sectional view illustrating a semiconductor package in accordance with some example embodiments;

FIGS. 27 to 30 are cross-sectional views illustrating operations for manufacturing a semiconductor package in accordance with some example embodiments; and FIG. 31 is a block diagram illustrating a schematic construction of an information processing system in accordance with some example embodiments.

DESCRIPTION OF EMBODIMENTS

Figure 2:
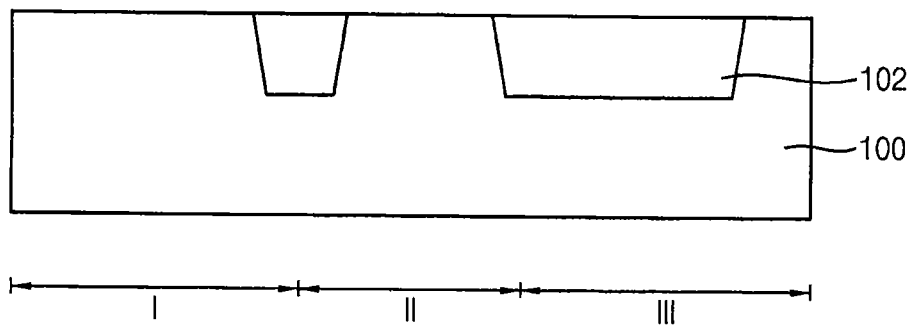

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A and 1B are cross-sectional views illustrating semiconductor devices in accordance with some embodiments. A semiconductor device may include a circuit device formed on a substrate 100, a through electrode structure 150, and a conductive structure electrically connected to the circuit device and the through electrode structure 150. A portion of the conductive structure may pass through a blocking layer pattern 165 and 165a to electrically connect to the through electrode structure 150.

In example embodiments, the semiconductor device may have a via-middle structure in which the through electrode structure 150 may be formed after a formation of the circuit device and before a formation of the conductive structure.

The substrate 100 may be a semiconductor substrate including, e.g., a single crystalline silicon substrate, a sing crystalline germanium substrate or a silicon-germanium substrate. A silicon-on-insulator (SOI) substrate or a germanium-on-insulator (GOI) substrate may be also used as the substrate 100.

The substrate 100 may include a first surface 100a and a second surface 100b on opposite sides of the substrate 100. For example, the first surface 100a and the second surface 100b may be an active surface and an inactive surface, respectively, of the substrate 100.

An isolation layer 102 may be formed in upper portions of the substrate 100 near the first surface 100a. The isolation layer 102 may include an insulation material, such as silicon oxide. In example embodiments, the substrate 100 may be divided into a first region I, a second region II and a third region III by the isolation layer 102.

The first region I may be a device region in which the circuit device of the semiconductor device may be formed. The third region III may be a via region in which the through electrode structure 150 may be formed. The second region II may be a buffer region for reducing stress transfer between the first and second regions I and II. In some embodiments, the second region II may have an area or a volume substantially smaller than that of each of the first and third regions I and III.

The circuit device, such as a transistor, may be formed on the substrate 100 in the first region I. The transistor may include a gate structure 120 and an impurity region 105 formed at an upper portion of the substrate 100 adjacent to the gate structure 120. The gate structure 120 may include a gate insulation layer pattern 110 and a gate electrode 115 stacked on the first surface 100a of the substrate 100. A gate spacer 125 may be further formed on a sidewall of the gate structure 120.

The gate insulation layer pattern 110 may include silicon oxide or a metal oxide. The gate electrode 115 may include, for example, doped polysilicon, a metal, a metal nitride, a metal silicide and/or a metal silicide nitride. The gate spacer 125 may include, for example, silicon nitride. In some embodiments, a different electronic element, such as a diode, a capacitor, a resistor, an inductor or the like, may be formed in the first region I of the substrate 100.

A first insulating interlayer 130 may be formed on the substrate 100 and may cover the transistor. The first insulating interlayer 130 may include, for example, a silicon-oxide based material, e.g., plasma enhanced oxide (PEOX), tetraethyl orthosilicate (TEOS), boro silicate glass: (BSG), phospho silicate glass (PSG), boro phospho silicate glass (BPSG), etc.

A contact plug 135 may extend through the first insulating interlayer 130 to be electrically connected to the circuit device. For example, the contact plug 135 may be in contact with the impurity region 105. In some embodiments, a portion of the contact plug 135 may be in contact with the gate electrode 115.

The contact plug 135 may include a first metal. In some embodiments, the contact plug 135 may include, for example, tungsten (W).

The through electrode structure 150 may extend through at least a portion of the third region III of the substrate 100, e.g., an upper portion of the third region III of the substrate 100. The through electrode structure 150 may extend through the first insulating interlayer 130 and into the substrate 100. For example, a bottom of the through electrode structure 150 may be located between the first surface 100a and the second surface 100b of the substrate 100. In some example embodiments, an upper portion of the through electrode structure 150 may protrude from a top surface of the first insulating interlayer 130.

In some example embodiments, a via hole 143 may extend through the first insulating interlayer 130 and into at least the portion of the substrate 100 in the third region III. The through electrode structure 150 may include a via insulation layer pattern 152, a barrier layer pattern 154 and a through electrode 156 stacked on an inner wall of the via hole 143. The via insulation layer pattern 152 and the barrier layer pattern 154 may conform to the inner wall of the via hole 143, and may have a substantially cup-like shape. The through electrode 156 may be disposed on the barrier layer pattern 154 and may have a cylindrical shape or a polygonal shape.

The via insulation layer pattern 152 may include a material having a low dielectric constant, such as a porous silicon oxide, siloxane or silsesquioxane. The barrier layer pattern 154 may include a conductive material, such as tantalum (Ta), tantalum nitride (TaNx), titanium (Ti), titanium nitride (TiNx), ruthenium (Ru), cobalt (Co), nickel (Ni), nickel boride (NiBx) or tungsten nitride (WNx).

The through electrode 156 may include a second metal. For example, the through electrode 156 may include a metal different from the first metal. In some embodiments, the through electrode 156 may include copper (Cu).

The through electrode 156 may be insulated from the substrate 100 by the via insulation layer pattern 152. Diffusion of components of the through electrode 156 may be blocked by the via insulation layer pattern 152.

An etch-stop layer pattern 162 may be disposed on a sidewall of an upper portion of the through electrode structure 150 that may protrude from the top surface of the first insulating interlayer 130. In some example embodiments, the etch-stop layer pattern 162 may be disposed on a portion of the first insulating interlayer 130 on the third region III, and may have a ring shape surrounding the sidewall of the through electrode structure 150. For example, the etch-stop layer pattern 162 may have a polygonal cross-section or a circular cross-section and may include a hole accommodating the upper portion of the through electrode structure 150. Top surfaces of the etch-stop layer pattern 162 and the through electrode structure 150 may be substantially coplanar. The etch-stop layer pattern 162 may include, for example, silicon nitride or silicon oxynitride.

A blocking layer pattern 165 and 165a may be formed on the etch-stop layer pattern 162. The blocking layer pattern 165 and 165a may have a ring shape having a polygonal cross-section or a circular cross-section which may be substantially the same as or similar to that of the etch-stop layer pattern 162. For example, the blocking layer pattern 165 and 165a may have the ring shape including a hole through which an interconnection structure 184a and 184b may extend. In some example embodiments, sidewalls of the blocking layer pattern 165 and 165a, and the etch-stop layer pattern 162 may extend on substantially the same plane.

As illustrated in FIG. 1A, the hole included in the blocking layer pattern 165 may have a width or a diameter greater than that of the top surface of the through electrode structure 150. In this case, the blocking layer pattern 165 may be disposed on a peripheral portion of the etch-stop layer pattern 162. As illustrated in FIG. 1B, the hole included in the blocking layer pattern 165a may have a width (e.g., a diameter) smaller than that of a top surface of the through electrode structure 150 or the through electrode 156. In this case, the blocking layer pattern 165a may cover top surfaces of the etch-stop layer pattern 162, the via insulation layer pattern 152 and the barrier layer pattern 154, and may partially cover the top surface of the through electrode 156. In some example embodiments, the blocking layer pattern 165 and 165a may include a nitride-based material such as silicon nitride.

The conductive structure may be disposed on the first insulating interlayer 130 and may be electrically connected to the contact plug 135 and the through electrode 156. The conductive structure may include a wiring structure 182 and the interconnection structure 184a and 184b. The wiring structure 182 and the interconnection structure 184a or 184b may be electrically connected to the contact plug 135 and the through electrode 156 through a second insulating interlayer 175 formed on the first insulating interlayer 130. The second insulating interlayer 175 may include, for example, silicon oxide substantially the same as or similar to that of the first insulating interlayer 130.

The wiring structure 182 and the interconnection structures 184a and 184b may be formed by a double damascene process. In this case, the wiring structure 182 and the interconnection structure 184a and 184b may be divided into a lower portion having a relatively small width and an upper portion having a relatively large width, as illustrated in FIGS. 1A and 1B.

In some example embodiments, the lower portion and the upper portion of the interconnection structures 184a and 184b may correspond to via portions 186a and 187a, wiring portions 186b and 187b, respectively. The via portions 186a and 187a may be in direct contact with the through electrode structure 150. The wiring portions 186b and 187b may be diverged from the via portion 186a and 187a. For example, the wiring portions 186b and 187b may serve as a routing wiring or a redistribution wiring.

In example embodiments, the wiring portions 186b and 187b may have a greater width than that of the via portions 186a and 187a, and may be connected to each other as an integral or single conductive member. Thus, the interconnection structures 184a and 184b may have, e.g., a T-shaped vertical cross-section.

In some embodiments, the wiring structure 182 and the interconnection structure 184a and 184b may be formed by a single damascene process. In this case, the lower and upper portions of the wiring structure 182 and the interconnection structures 184a and 184b may have substantially the same widths. The interconnection structures 184a and 184b may extend through the second insulating interlayer 175 and the blocking layer pattern 165, and may be in contact with the through electrode 156.

In some embodiments, a barrier conductive layer may be formed before the formation of the wiring structure 182 and the interconnection structures 184a and 184b. For example, a first barrier conductive layer 181 may cover a bottom and a sidewall of the wiring structure 182. Second barrier conductive layers 185a and 185b may cover bottoms and sidewalls of the interconnection structures 184a and 184b.

As illustrated in FIG. 1A, the second barrier conductive layer 185a may be also in contact with the second insulating interlayer 175, the blocking layer pattern 165 and the etch-stop layer pattern 162. Accordingly, a weak adhesion and an impurity diffusion occurring when the interconnection structure 184a is formed directly on different insulation layers may be prevented. The barrier conductive layers may include a metal nitride, such as titanium nitride or tantalum nitride.

Hereinafter, the barrier conductive layers are described as single or integral elements together with the wiring structure 182 and the interconnection structure 184a and 184b.

As illustrated in FIG. 1A, an area of the via portion 186a may be greater than the top surface area of the through electrode structure 150. In this case, the top surface of the through electrode structure 150 may be substantially and entirely covered by the via portion 186a. Thus, a stress generated by an expansion of the through electrode 156 may be efficiently absorbed by the via portion 186a.

As illustrated in FIG. 1B, a bottom of the via portion 187a may be smaller than the top surface of the through electrode structure 150. In this case, the via portion 187a may contact a portion of the top surface of the through electrode 156.

In the embodiments as described above, exposure of the contact plug 135 and the through electrode 156 to external air before the formation of the conductive structure by the blocking layer pattern 165 may be prevented. Thus, generation of a metal residue from the contact plug 135 and the through electrode 156 may be avoided.

Figure 10:
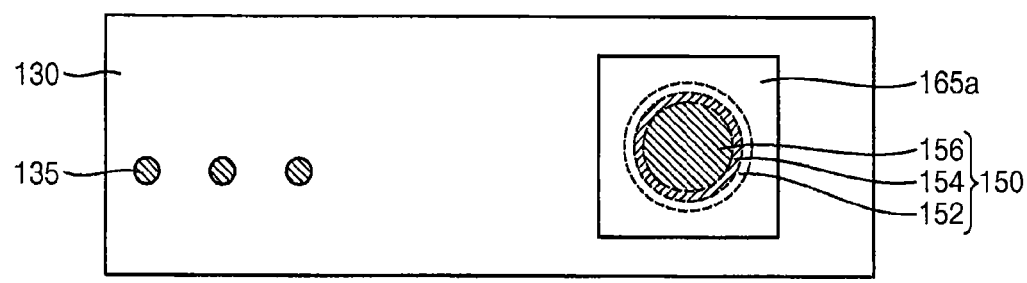
Figure 11:
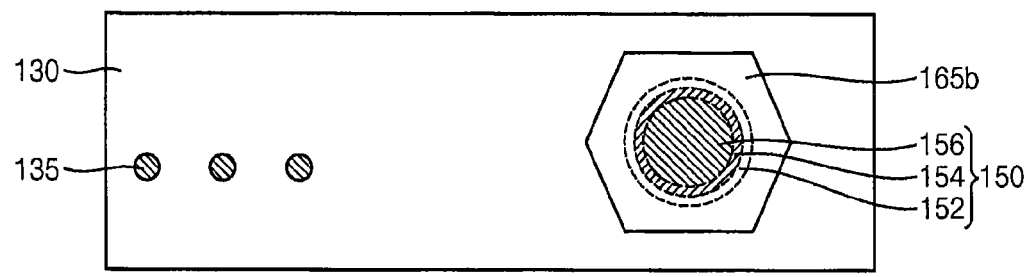
Figure 12:
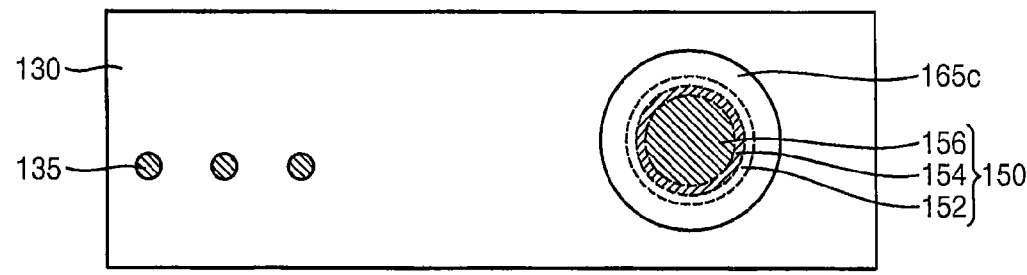

FIGS. 2 to 14, and FIGS. 15A and 15B are cross-sectional views and top plan views illustrating operations for manufacturing a semiconductor device in accordance with example embodiments. For example, FIGS. 2 to 15B illustrate operations for manufacturing the semiconductor devices of FIGS. 1A and 1B. Specifically, FIGS. 2 to 9, and FIGS. 13 to 15B are cross-sectional view illustrating the operations. FIGS. 10 to 12 are top plan views illustrating shapes of a blocking layer pattern.

Referring to FIG. 2, an isolation layer 102 may be formed on a substrate 100. The substrate 100 may be a semiconductor substrate, for example, a single crystalline silicon substrate, a single crystalline germanium substrate or a silicon-germanium substrate. In some embodiments, the substrate 100 may be a silicon on insulator (SOI) substrate or a germanium on insulator (GOI) substrate.

The isolation layer 102 may be formed in an upper portion of the substrate 100 using, for example, a shallow trench isolation (STI) process. For example, the upper portion of the substrate 100 may be etched to form trenches. A silicon oxide layer may be formed on the substrate 100 and filling the trenches, and an upper portion of the silicon oxide layer may be planarized to form the isolation layer 102.

The substrate 100 may include a first region I, a second region II and a third region III by the isolation layer 102. The first region I and the third region III may be provided as a device region and a via region, respectively. The second region II may be interposed between the first region I and the third region III, and may serve as a buffer region which may be provided in consideration of thermal or mechanical stress generated by, for example, a thermal expansion of a through electrode 156 (see FIG. 6). For example, a circuit device may not be formed on the second region II, and the second region II may be provided as a keep-out zone (KOZ). In some embodiments, the isolation layer 120 formed on the third region III may be relatively thick. Accordingly, a stress generated from the through electrode 156 may be absorbed or reduced.

Figure 3:
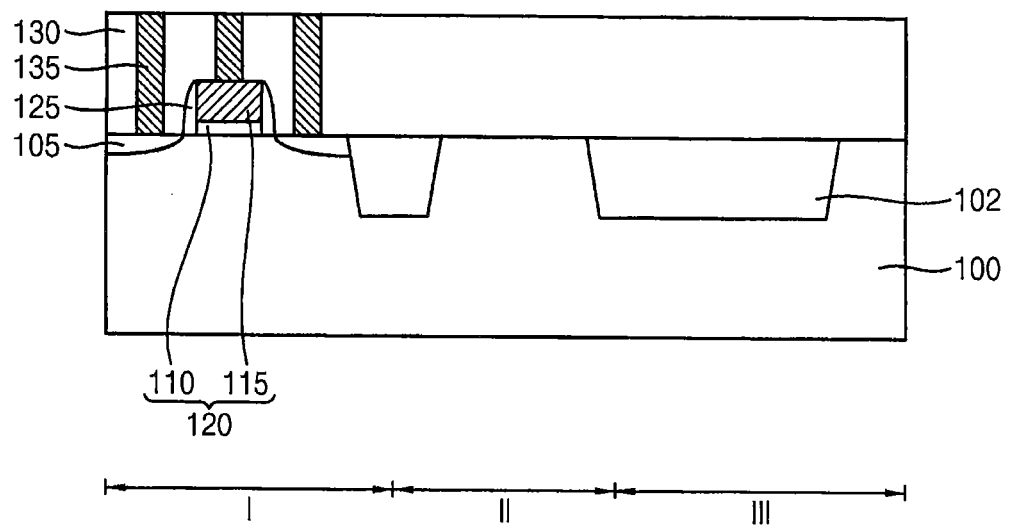

Referring to FIG. 3, the circuit device may be formed on the first region I of the substrate 100 using, for example, a front-end-of-line (FEOL) process. The circuit device may include, for example, a transistor.

A gate insulation layer and a gate electrode layer may be sequentially formed on the substrate 100 and the isolation layer 102. The gate insulation layer and the gate electrode layer may be patterned using, for example, a photolithography process, to form a gate insulation layer pattern 110 and a gate electrode 115 stacked on the first region I of the substrate 100. Accordingly, a gate structure 120 including the gate insulation layer pattern 110 and the gate electrode 115 may be formed.

The gate insulation layer may be formed using an oxide-based material, e.g., silicon oxide or a metal oxide. The gate insulation layer may be formed by a chemical vapor deposition (CVD) process, a plasma enhanced chemical vapor deposition (PECVD) process, a low pressure chemical vapor deposition (LPCVD) process, a spin coating process, etc. In some embodiments, the gate insulation layer may be formed using a thermal oxidation process on a top surface of the substrate 100.

The gate electrode layer may be formed using, for example, doped polysilicon, a metal, a metal nitride, a metal silicide and/or a metal silicide nitride. For example, the gate electrode layer may be formed using, for example, a physical vapor deposition (PVD) process, a sputtering process or an atomic layer deposition (ALD) process.

In some embodiments, a spacer layer covering the gate structure 120 may be formed on the substrate 100 and the isolation layer 102. The spacer layer may be anisotropically etched to form a gate spacer 125 on a sidewall of the gate structure 120. The spacer layer may be formed using a nitride-based material, such as silicon nitride.

Impurities may be doped at an upper portion of the substrate 100 adjacent to the gate structure 120 by an ion-implantation process, thus forming an impurity region 105. Accordingly, the transistor including the gate structure 120 and the impurity region 105 may be formed on the first region I of the substrate 100. The impurity region 105 may serve as a source/drain region of the transistor.

FIG. 3 illustrates only one transistor, however, a plurality of the transistors may be formed on the first region I of the substrate 100. Further, various electronic elements such as diodes, capacitors, conductive lines (e.g., such as word lines and/or a bit lines), etc., may be formed on the first region I of the substrate 100 as the circuit device.

A first insulating interlayer 130 covering the circuit device may be formed on the substrate 100. Contact plugs 135 may be formed, passing through the first insulating interlayer 130 to contact the impurity region 105. In some embodiments, at least one of the contact plugs 135 may be in contact with the gate electrode 115. The first insulating interlayer 130 may be a silicon oxide layer, such as a PEOX layer, TEOS layer, BSG layer, PSG layer, BPSG layer, or the like, formed using, for example, a CVD process.

The first insulating interlayer 130 may be partially removed to form contact holes through which the impurity region 105 may be exposed. In some embodiments, a top surface of the gate electrode 115 may be also exposed through the contact holes. A first conductive layer may be formed on the first insulating interlayer 130, filling the contact holes. An upper portion of the first conductive layer may be planarized using, for example, a chemical mechanical polish (CMP) process, until a top surface of the first insulating interlayer 130 is exposed, thus forming the contact plugs 135.

In some example embodiments, the first conductive layer may be formed using a first metal by a sputtering process, an ALD process, or a PVD process. For example, tungsten may be used as the first metal.

Figure 4:
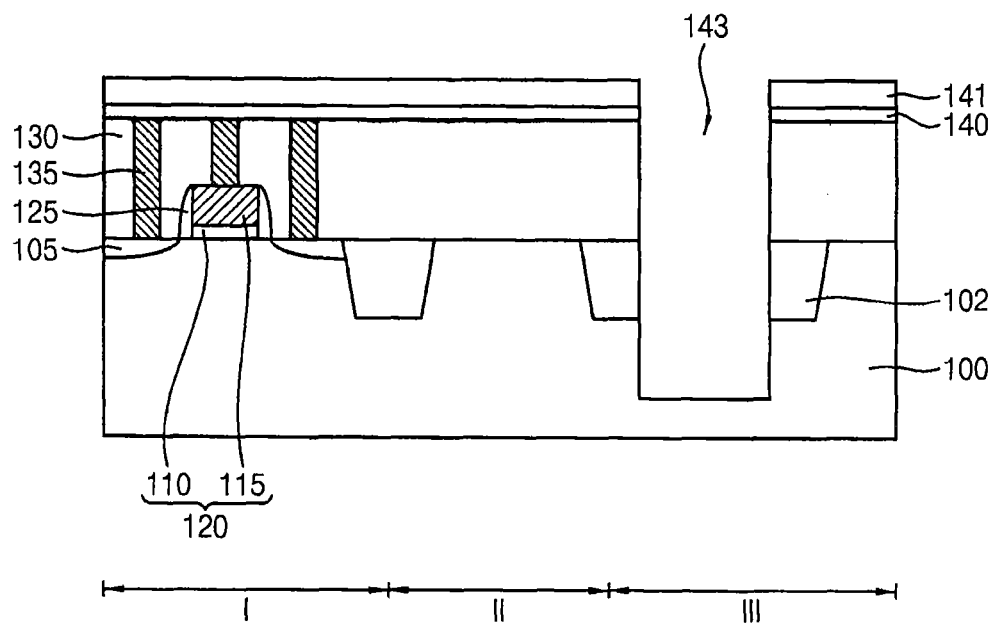

Referring to FIG. 4, an etch-stop layer 140 covering the contact plugs 135 may be formed on the first insulating interlayer 130. A via hole 143 may be formed, extending through the etch-stop layer 140, the first insulating interlayer 130, the isolation layer 102 and the substrate 100. In some example embodiments, the etch-stop layer 140 may be formed of silicon nitride or silicon oxynitride by, e.g., a CVD process.

The via hole 143 may be formed on the third region III of the substrate 100. In some example embodiments, the via hole 143 may be formed through portions of the etch-stop layer 140, the first insulating interlayer 130 and isolation layer 102 on the third region III, and partially through the substrate 100 of the third region III. A bottom of the via hole 143 may be located between upper and lower surfaces of the substrate 100.

For example, a photoresist layer may be formed on the etch-stop layer 140, a portion of the photoresist layer formed on the third region III may be removed by exposure and developing processes to form a first photoresist pattern 141. The etch-stop layer 140 may serve as an anti-reflective layer while performing the exposure process. The etch-stop layer 140, the first insulating interlayer 130, the isolation layer 102 and the substrate 100 may be partially and sequentially etched using the first photoresist pattern 141 as an etching mask to form the via hole 143. The first photoresist pattern 141 may be removed by an ashing process and/or a strip process after the formation of the via hole 143.

Figure 5:
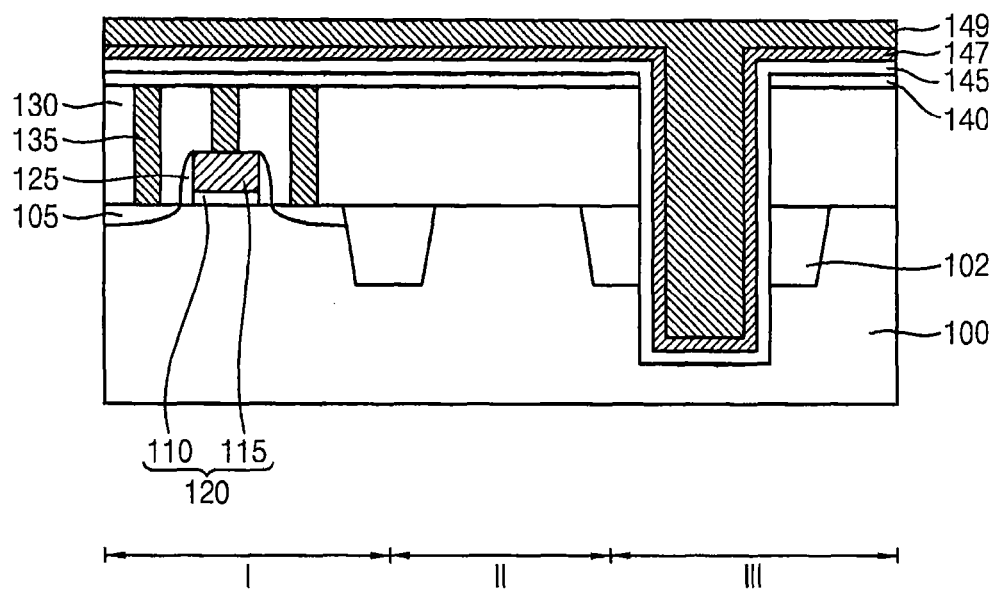

Referring to FIG. 5, a via insulation layer 145, a barrier layer 147 and a second conductive layer 149 may be sequentially formed to fill the via hole 143. For example, the via insulation layer 145 may be formed such that it conforms to a top surface of the etch-stop layer 140 and an innerwall of the via hole 143. The via insulation layer 145 may be formed of a material having a low dielectric constant to reduce parasitic capacitance. For example, the via insulation layer 145 may be formed of a porous silicon oxide, siloxane or silsesquioxane based materials.

The barrier layer 147 may be formed such that it conforms to the via insulation layer 145. The barrier layer 147 may be formed of a conductive material including, for example, tantalum, tantalum nitride, titanium, titanium nitride, ruthenium, cobalt, nickel, nickel boride, tungsten nitride, or the like.

The second conductive layer 149 may be formed on the barrier layer 147 to fill a remaining portion of the via hole 143. The second conductive layer 149 may be converted into the through electrode 156 by subsequent operations. In some example embodiments, the second conductive layer 149 may be formed using a second metal. The second metal may be different from the first metal of the contact plug 135. In some embodiments, the second conductive layer 149 may be formed using copper having a high conductivity and a low resistance.

The via insulation layer 145, the barrier layer 147 and the second conductive layer 149 may be formed by at least one of a CVD process, a sputtering process, a PVD process and an ALD process. In some embodiments, a seed layer including copper may be formed on the first barrier layer 147, and an electroplating process may be performed using the seed layer to form the second conductive layer 149.

Figure 6:
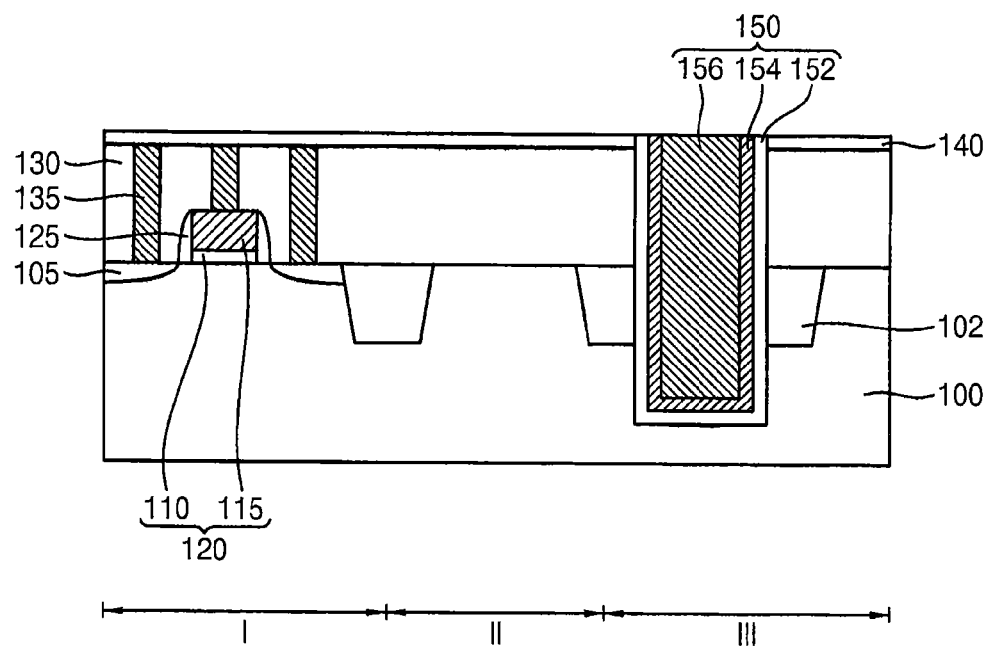

Referring to FIG. 6, upper portions of the second conductive layer 149, the barrier layer 147 and the via insulation layer 145 may be planarized by a CMP process until a top surface of the etch-stop layer 140 is exposed. Accordingly, a through electrode structure 150 filling the via hole 143 may be obtained. The through electrode structure 150 may include a via insulation layer pattern 152, a barrier layer pattern 154 and the through electrode 156 stacked on the inner wall of the via hole 143. The etch-stop layer 140 may substantially serve as a polish stopper in the CMP process.

Figure 7:
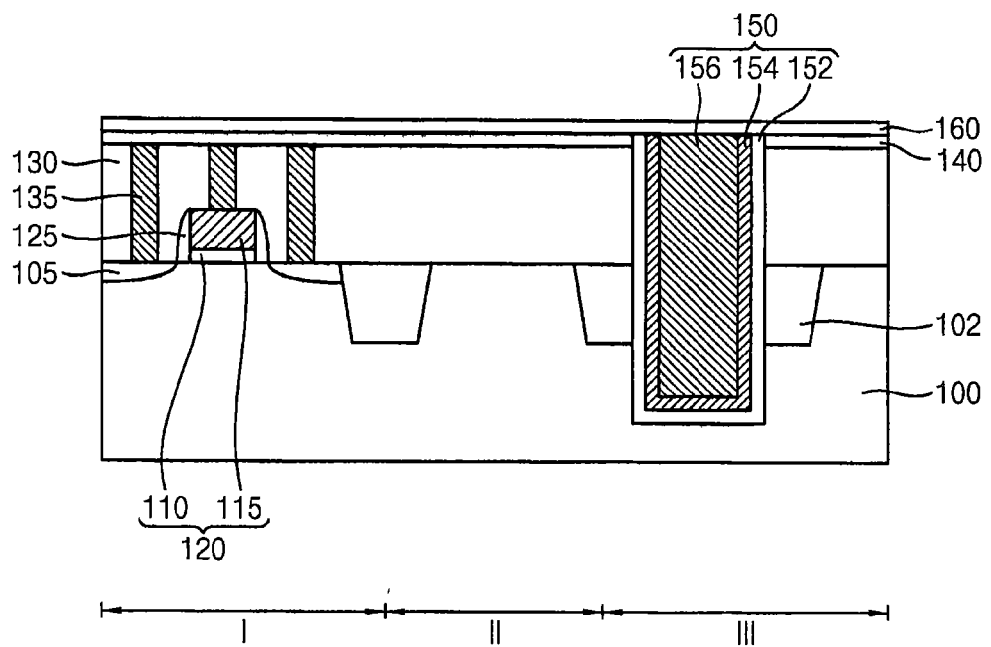

The via insulation layer pattern 152 and the barrier layer pattern 154 may conform to the inner wall of the via hole 143, and may have a cup-like shape surrounding lateral and bottom portions of the through electrode 156. The through electrode 156 may have, for example, a cylindrical shape or a polygonal shape. Referring to FIG. 7, a blocking layer 160 covering the through electrode structure 150 may be formed on the etch-stop layer 140. In some example embodiments, the blocking layer 160 may be formed of a nitride-based material, such as silicon nitride formed using a CVD process.

Figure 8:
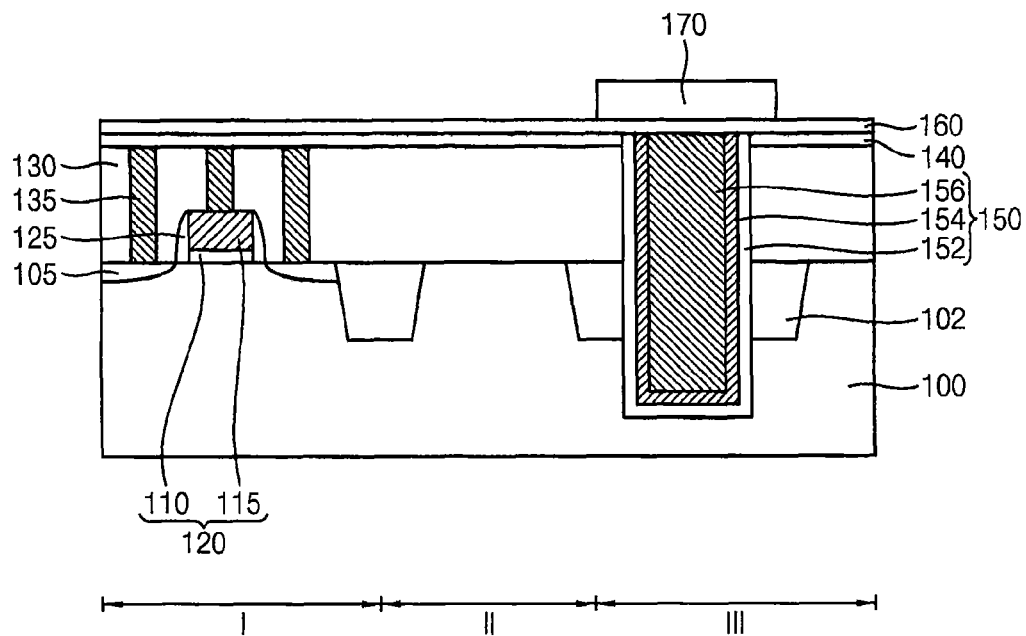

Referring to FIG. 8, a second photoresist pattern 170 may be formed on the blocking layer 160. For example, a second photoresist layer may be formed on the blocking layer 160.

The second photoresist layer may be partially removed by exposure and developing processes to form the second photoresist pattern 170. The etch-stop layer 140 and/or the blocking layer 160 may serve as an anti-reflective layer during the exposure process. In some example embodiments, the second photoresist pattern 170 may entirely cover a top surface of the through electrode structure 150. For example, the second photoresist pattern 170 may have a cross-section larger than the top surface of the through electrode structure 150.

Figure 9:
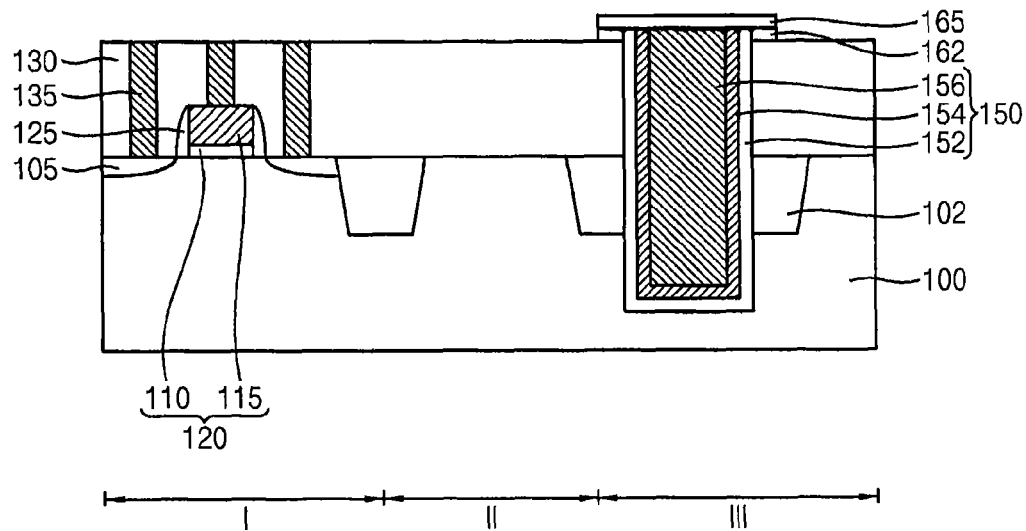

Referring to FIG. 9, the blocking layer 160 and the etch-stop layer 140 may be partially removed using the second photoresist pattern 170 as an etching mask. A as a result, a blocking layer pattern 165 and an etch-stop layer pattern 162 may be formed.

In some embodiments, the blocking layer 160 and the etch-stop layer 140 may be partially removed by an etch-back process. In some embodiments, the blocking layer 160 and the etch-stop layer 140 may be partially removed by a wet etching process in which an etchant solution having an etching selectivity for a nitride, e.g., phosphoric acid or sulfuric acid, may be employed.

The etch-stop layer pattern 162 may be formed on the first insulating interlayer 130 and may have a ring shape surrounding an upper portion of the through structure 150. The blocking layer pattern 165 may be formed on top surfaces of the etch-stop layer pattern 162 and the through electrode structure 150.

In some example embodiments, the blocking layer pattern 165 may have a cross-section greater than the top surface of the through electrode structure 150. Thus, the top surface of the through electrode structure 150 may be completely covered by the blocking layer pattern 165, and may not be exposed to external air.

The blocking layer pattern 165 may be formed as various shapes as illustrated in FIG. 10 to 12, which are top planar views of FIG. 9. As illustrated in FIGS. 10 and 11, the blocking layer patterns 165a and 165b may have substantially polygonal tile shapes, e.g., rectangular or hexagonal shapes covering the through electrode structure 150. As illustrated in FIG. 12, the blocking layer pattern 165c may have a tile shape having a substantially circular cross-section.

In some embodiments, a cleaning process may be performed to remove an etching residue after the formation of the blocking layer pattern 165 and the etch-stop layer pattern 162. A solution including at least one of ammonium hydroxide, hydrogen peroxide or fluoric acid may be used for the cleaning process. Etching residue that may be present on the first insulating interlayer 130 and the contact plug 135 may be removed by the solution. In some example embodiments, the top surface of the through electrode 156 may not be exposed while performing the etch-back process for removing the etch-stop layer 140 and/or the cleaning process because the through electrode 156 may be completely covered by the blocking layer pattern 165.

If top surfaces of the through electrode 156 and the contact plug 135 are exposed together or simultaneously, a metal by-product may be created to result in an operational failure of the semiconductor device. For example, the second metal contained in the through electrode 156 and the first metal contained in the contact plug 135 may be different from each other in some aspect, e.g., a reactivity or an affinity with respect to conditions of the cleaning process or the etch-back process. Accordingly, one of the first metal and the second metal may migrate as a result of the cleaning process and/or the etch-back process. For example, copper in the through electrode 156, which may have a relatively strong reactivity, may migrate toward the contact plug 135, which includes tungsten, causing a short circuit.

According to some embodiments of the inventive concept, however, the top surface of the through electrode 156 may be capped or covered by the blocking layer pattern 165 so that a generation of the metal by-product including the second metal, e.g., copper may be prevented. In addition, stress generated due to a coefficient thermal expansion (CTE) difference of the through electrode 156 may be absorbed or buffered by the blocking layer pattern 165 capping the through electrode 156. Accordingly, the blocking layer pattern 165 may substantially serve as a stress buffer layer pattern. Therefore, a volume or a dimension of the second region II that may be allotted as a KOZ or a buffer region may be reduced.

Figure 13:
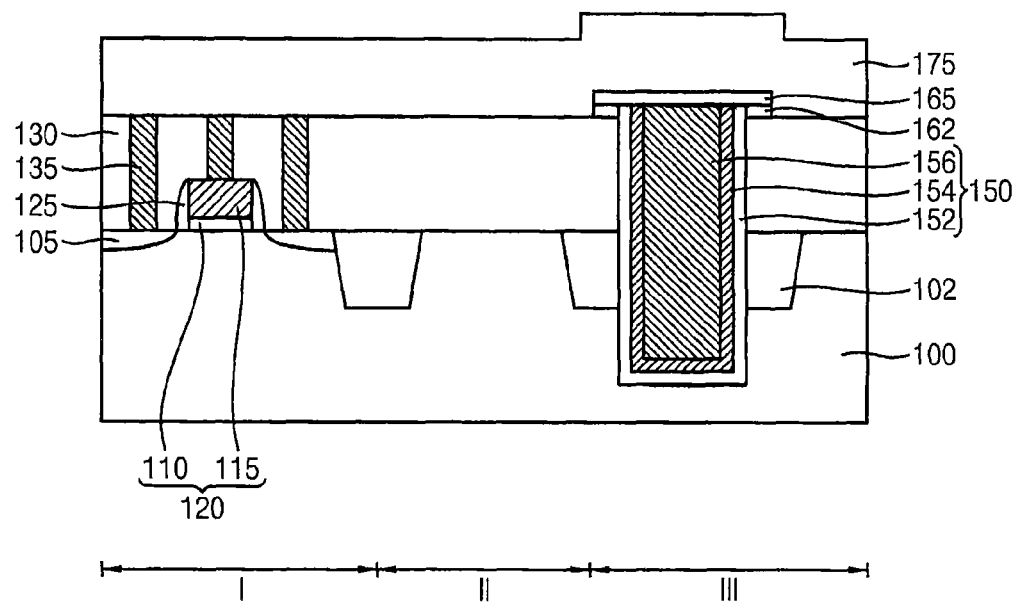

Subsequently, a back-end-of-line (BEOL) process as illustrated in FIGS. 13 to 15B may be performed to form a wiring structure. Referring to FIG. 13, a second insulating interlayer 175 covering the contact plug 135 and the blocking layer pattern 165 may be formed on the first insulating interlayer 130. The second insulating interlayer 175 may be formed, for example, of silicon oxide substantially the same as or similar to that of the first insulating interlayer 130 using, for example, a CVD process.

In some embodiments, the second insulating interlayer 175 may include a protruding or stepped portion, which may substantially overlap the blocking layer pattern 165. In some embodiments, the second insulating interlayer 175 may be sufficiently thick to provide a substantially leveled or planar top surface.

Figure 14A:
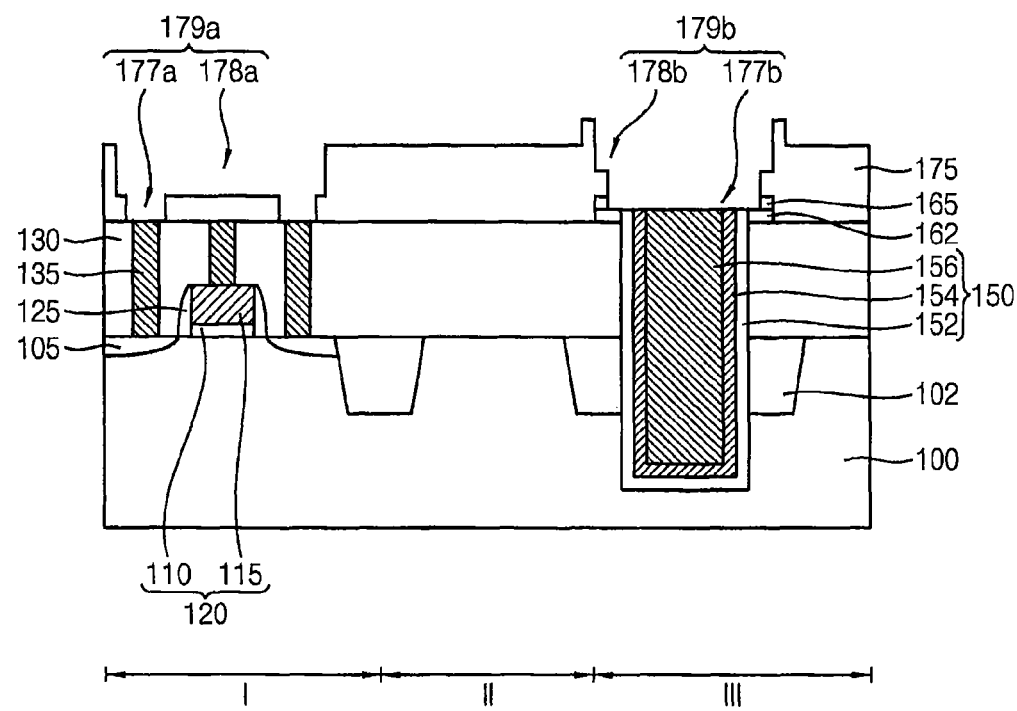

Referring to FIG. 14A, the second insulating interlayer 175 and the blocking layer pattern 165 may be partially removed to form a first opening 179a and a second opening 179b exposing the contact plug 135 and the through electrode structure 150, respectively. The first and second openings 179a and 179b may be simultaneously formed in substantially the same process stage.

In some example embodiments, the first and second openings 179a and 179b may be formed by a double damascene process. In this case, sidewalls of the first opening 179a and the second opening 179b may have stepped structures. For example, the second insulating interlayer 175 and the blocking layer pattern 165 may be partially removed to form a first hole 177a and a second hole 177b exposing the contact plug 135 and the through electrode structure 150, respectively. An upper portion of the second insulating interlayer 175 may be further removed to form a first trench 178a and a second trench 178b which may have a width or a diameter greater than that of the first hole 177a and the second hole 177b, respectively. The first trench 178a may be in a fluid communication with the first hole 177a to form the first opening 179a. The second trench 178b may be in a fluid communication with the second hole 177b to form the second opening 179b. In some embodiments, the first and second trenches may be formed, and then the first and second holes may be further formed to obtain the first and second openings 179a and 179b.

In some embodiments, the first and second openings 179a and 179b may be formed by a single damascene process. In this case, sidewalls of the first and second openings 179a and 179b may not include a stepped structure and may have a continuous profile.

As illustrated in FIG. 14A, the top surface of the through electrode structure 150 may be completely exposed by the second opening 179b. Accordingly, a diameter of the second opening 179b may be greater than that of the top surface of the through electrode structure 150. A portion of the blocking layer pattern 165 covering the through electrode structure 150 may be entirely removed. The remaining blocking layer pattern 165 may have a ring shape formed on a peripheral portion of a top surface of the etch-stop layer pattern 162. For example, the blocking layer pattern 165 may have the ring shape having a circular or polygonal cross-section.

Figure 14B:
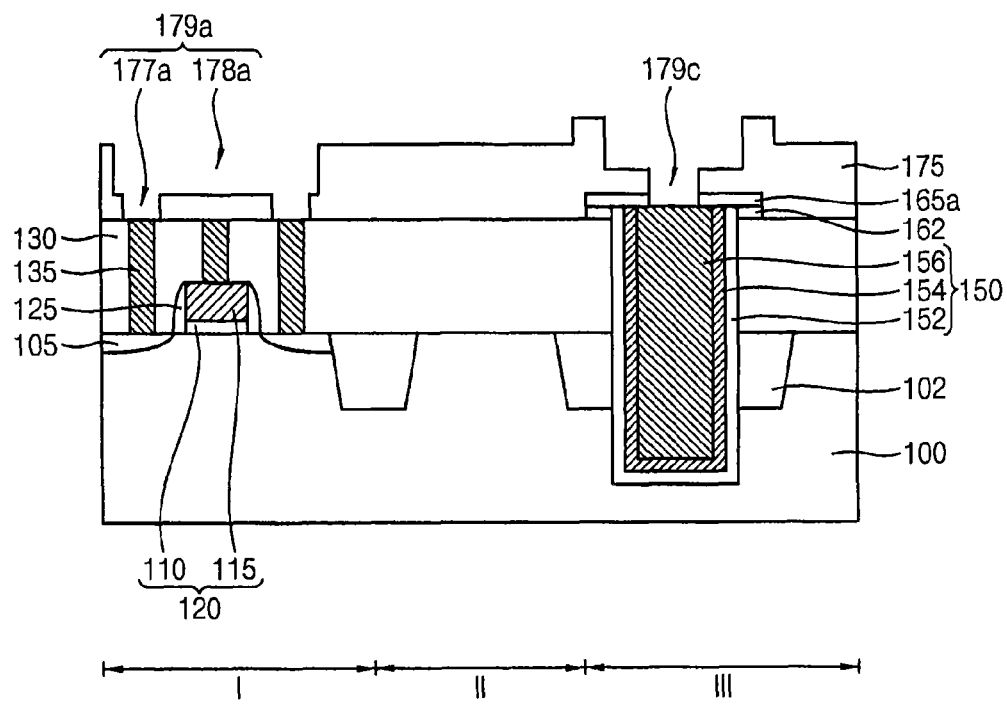

As illustrated in FIG. 14B, the top surface of the through electrode structure 150 may be partially exposed by a second opening 179c. For example, the top surface of the through electrode 156 may be partially exposed through the second opening 179c.

In this case, a diameter of a lower portion of the second opening 179c may be smaller than that of the top surface of the through electrode 156. The blocking layer pattern 165 may be formed on the etch-stop layer pattern 162, and may have a ring shape partially covering the top surface of the through electrode structure 150. As illustrated in FIG. 14B, an area of the through electrode 150 exposed through the second opening 179c may be decreased so that an etching damage of the through electrode 150 may be reduced.

Figure 15A:
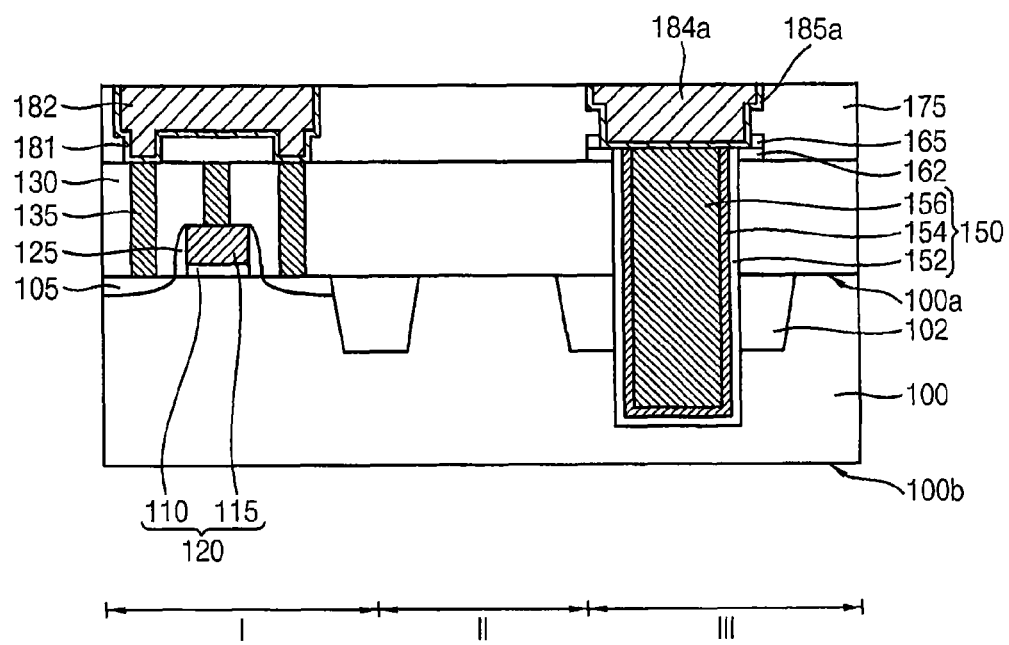
Figure 15B:
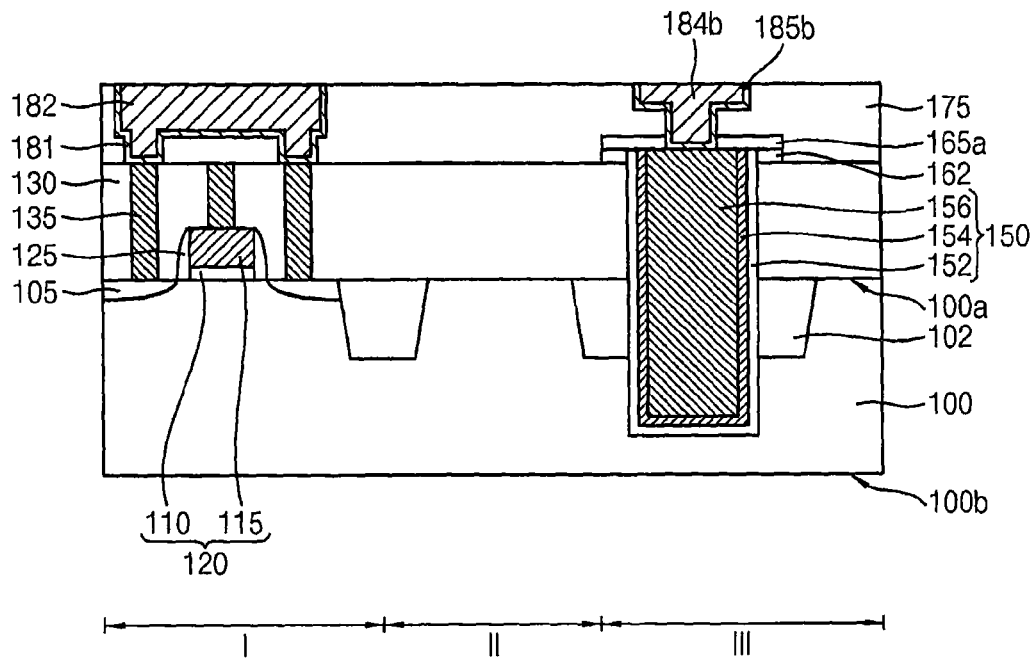

Referring to FIGS. 15A and 15B, a wiring structure 182 and an interconnection structure 184a and 184b may be formed in the first opening 179a and the second opening 179b and 179c, respectively. The wiring structure 182 and the interconnection structure 184a and 184b may be electrically connected to the contact plug 135 and the through electrode 156, respectively.

In example embodiments, a third conductive layer filling the first and second openings may be formed on the second insulating interlayer 175. Upper portions of the third conductive layer and the second insulating interlayer 175 may be planarized by a CMP process. For example, the protruding or stepped portion of the second insulating interlayer 175 may be removed such that top surfaces of the third conductive layer and the second insulating interlayer 175 may be coplanar. Accordingly, the wiring structure 182 and the interconnection structure 184a and 184b may be formed in the first opening 179a and the second opening 179b and 179c, respectively.

In some embodiments, a seed layer including copper or tungsten may be formed such that it conforms to the top surface of the second insulating interlayer 175 and inner walls of the first and second openings 179a, 179b and 179c. The seed layer may be formed using, for example, a sputtering process or a PVD process. An electroplating process utilizing the seed layer may be performed to form the third conductive layer filling the first and second openings 179a, 179b and 179c.

In some embodiments, a barrier conductive layer may be formed before the formation of the seed layer to improve adhesion of the seed layer and reduce impurity diffusion. In this manner, a first barrier conductive layer 181 and a second barrier conductive layer 185a and 185b may be formed on the innerwalls of the first opening 179a and the second opening 179b and 179c, respectively. The barrier conductive layer may be formed of a metal nitride, such as titanium nitride or tantalum nitride, using, for example, you a sputtering process or an ALD process.

Hereinafter, the barrier conductive layers are described as single or integral members of the wiring structure 182 and the interconnection structure 184a and 184b.

As illustrated with reference to FIGS. 1A and 1B, the interconnection structure 184a and 184b may be divided into a via portion and a wiring portion. For example, the via portion and the wiring portion may be formed in the second hole 177b and the second trench 178b, respectively.

As illustrated in FIG. 15A, if the second opening 179b has a diameter greater than that of the through electrode structure 150 (see FIG. 14A), the interconnection structure 184a may entirely cover the through electrode structure 150. The interconnection structure 184a may be also in contact with the top surface of the etch-stop layer pattern 162. The interconnection structure 184a may completely cover the through electrode 156, and thus a stress generated due to, for example, an expansion of the through electrode 156, may be efficiently absorbed by the interconnection structure 184a. As illustrated in FIG. 15B, if the second opening 179c has a diameter smaller than that of the through electrode structure 150 (see FIG. 14B), the interconnection structure 184b may be in contact with a portion of the top surface of the through electrode 156.

Figure 16A:
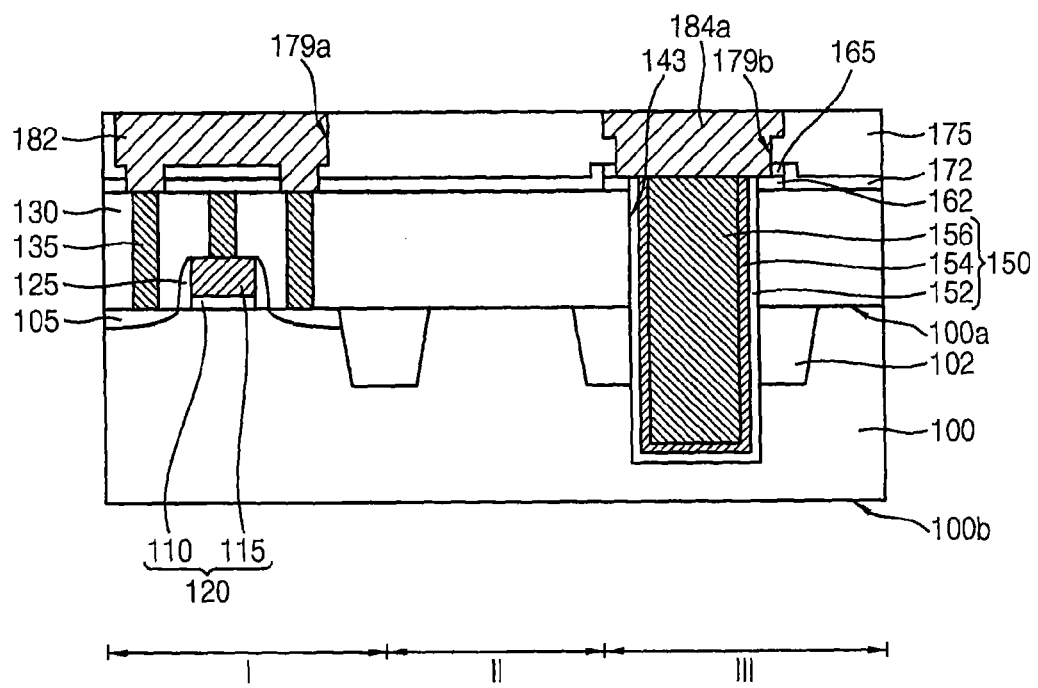
FIGS. 16A and 16B are cross-sectional views illustrating semiconductor devices in accordance with some example embodiments.
Figure 16B:
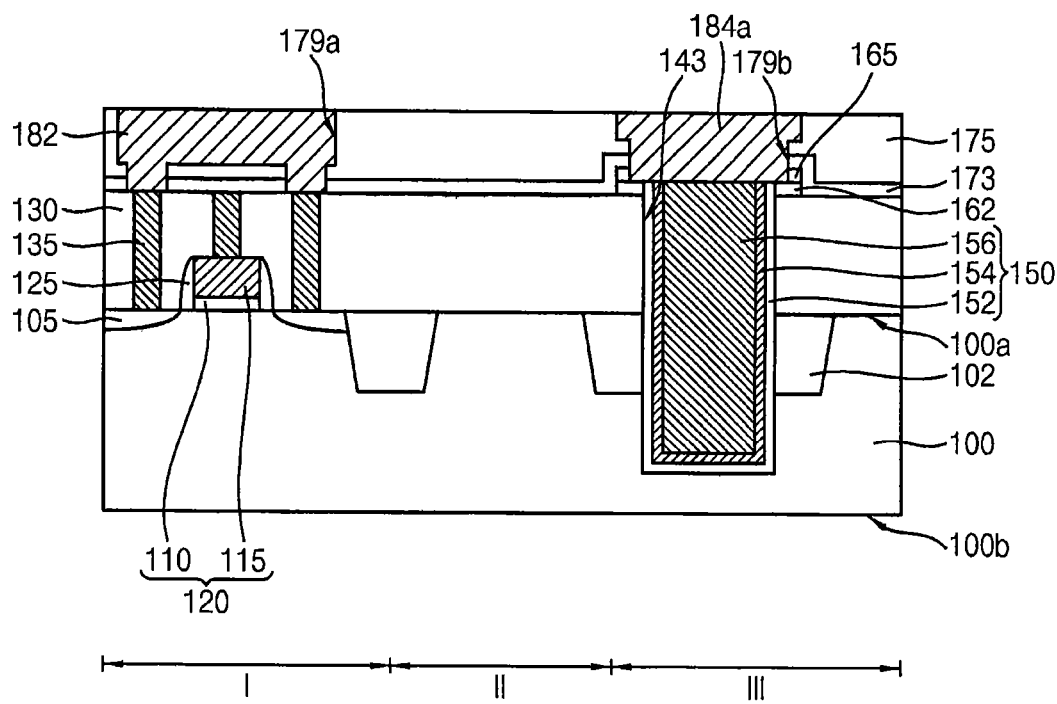

FIGS. 16A and 16B are cross-sectional views illustrating semiconductor devices in accordance with further example embodiments. The semiconductor devices of FIGS. 16A and 16B may have elements and/or constructions substantially the same as or similar to those of the semiconductor devices illustrated in FIGS. 1A and 1B, with like items identified by like reference numerals. Repeated description of such like items is omitted in light of the foregoing description.

Referring to FIGS. 16A and 16B, and also illustrated with reference to FIGS. 1A and 1B, the semiconductor device may include a circuit device, such as a transistor, formed on a substrate, a through electrode structure 150, and a conductive structure including a wiring structure 182 and an interconnection structure 184a that may be electrically connected to the circuit device and the through electrode structure 150, respectively. The wiring structure 182 and the interconnection structure 184a may be formed in the first opening 179a and the second opening 179b, respectively. In some embodiments, as illustrated in FIGS. 1A and 1B, a first barrier conductive layer and a second barrier conductive layer may be formed under the wiring structure 182 and the interconnection structure 184a, respectively.

As described above, a contact plug 135 may be formed on a first region I of the substrate 100, and may extend through the first insulating interlayer 130 to electrically connect to the circuit device. The through electrode structure 150 may extend through the first insulating interlayer 130 and the substrate 100 in a third region III.

An etch-stop layer pattern 162 may be formed on the first insulating interlayer 130 and surround an upper sidewall of the through electrode structure 150. A blocking layer pattern 162 may be disposed on the etch-stop layer pattern 165.

In some example embodiments, a passivation layer 172 may be formed on the first insulating interlayer 130. For example, the passivation layer 172 may be interposed between the first insulating interlayer 130 and a second insulating interlayer 175. The passivation layer 172 may include a nitride-based material, such as silicon nitride. In some embodiments, the passivation layer 172 may include a material substantially the same as or similar to that of the blocking layer pattern 165.

As illustrated in FIG. 16A, the passivation layer 172 may be formed on a top surface of the first insulating interlayer 130, and on sidewalls of the blocking layer pattern 165 and the etch-stop layer pattern 162. The wiring structure 182 may extend through the second insulating interlayer 175 and the passivation layer 172 to contact the contact plug 135. The interconnection structure 184a may extend through the second insulating interlayer 175 and the blocking layer pattern 165 to contact the through electrode structure 150.

In some embodiments, as illustrated in FIG. 1B, a bottom of the interconnection structure may have a cross-section smaller than a top surface of a through electrode 156. Accordingly, the interconnection structure may partially contact the top surface of the through electrode 156.

As illustrated in FIG. 16B, a passivation layer 173 may be formed on the first insulating interlayer 130 and may cover a top surface of the blocking layer pattern 165. The interconnection structure 184a may extend through the second insulating interlayer 175, the passivation layer 173 and the blocking layer pattern 165 to contact the through electrode structure 150. In some embodiments, the passivation layer 173 and the blocking layer pattern 165 may include the substantially the same nitride-based material, and may be integral or merged with one another.

According to some example embodiments described above, the passivation layer 172 and 173 may be formed before the formation of the conductive structure. Thus, an etching process condition including, e.g., an etching thickness or an etching amount for the formation of the first opening 179a and the second opening 179b may become more uniform. Therefore, an etching damage of the contact plug 135 may be reduced.

FIGS. 17 to 20 are cross-sectional views illustrating operations for manufacturing a semiconductor device in accordance with some example embodiments. In particular For example, FIGS. 17 to 20 illustrate operations that may be used to manufacture the semiconductor devices of FIGS. 16A and 16B. Detailed descriptions on processes and/or materials substantially the same as or similar to those illustrated with reference to FIGS. 2 to 15B are omitted in light of the foregoing description thereof.

Figure 17:
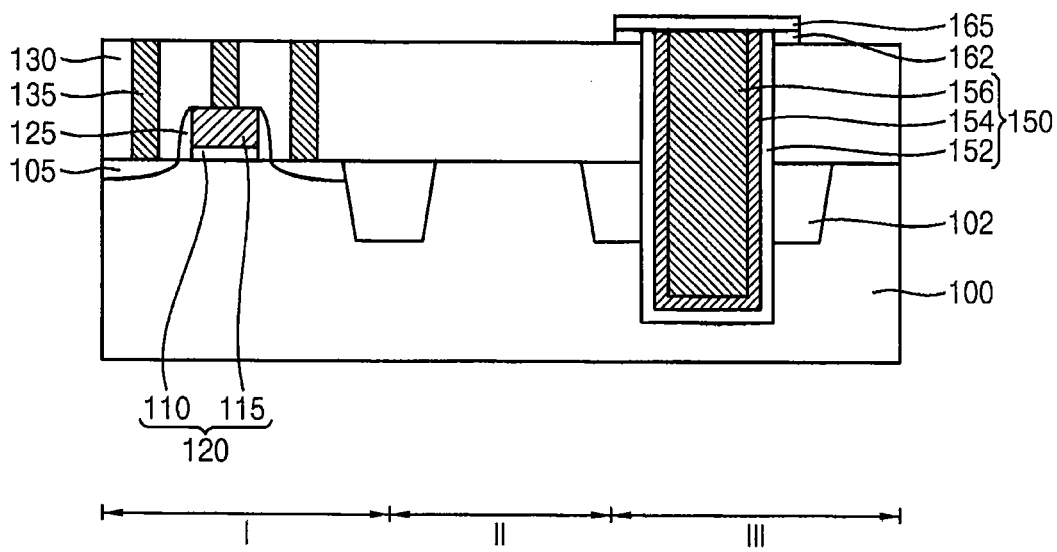

Referring to FIG. 17, processes substantially the same as or similar to those illustrated with reference to FIGS. 2 to 9 may be performed. And isolation layer 102 may be formed on the substrate 100 such that the substrate 100 may be divided into a first region I, a second region II and a third region III. A circuit device including a gate structure 120 and an impurity region 105 may be formed on the first region I of the substrate 100. A first insulating interlayer 130 covering the circuit device may be formed on the substrate 100.

A contact plug 135 may be formed through the first insulating interlayer 130 to be electrically connected to the circuit device. A through electrode structure 150 extending through the first insulating interlayer 130 and at least partially into the substrate 100 may be formed on the third region III of the substrate 100. An etch-stop layer pattern 162 surrounding an upper sidewall of the through electrode structure 150 may be formed on the first insulating interlayer 130. A blocking layer pattern 165 covering the through electrode structure 150 may be formed on the etch-stop layer pattern 162.

Figure 18:
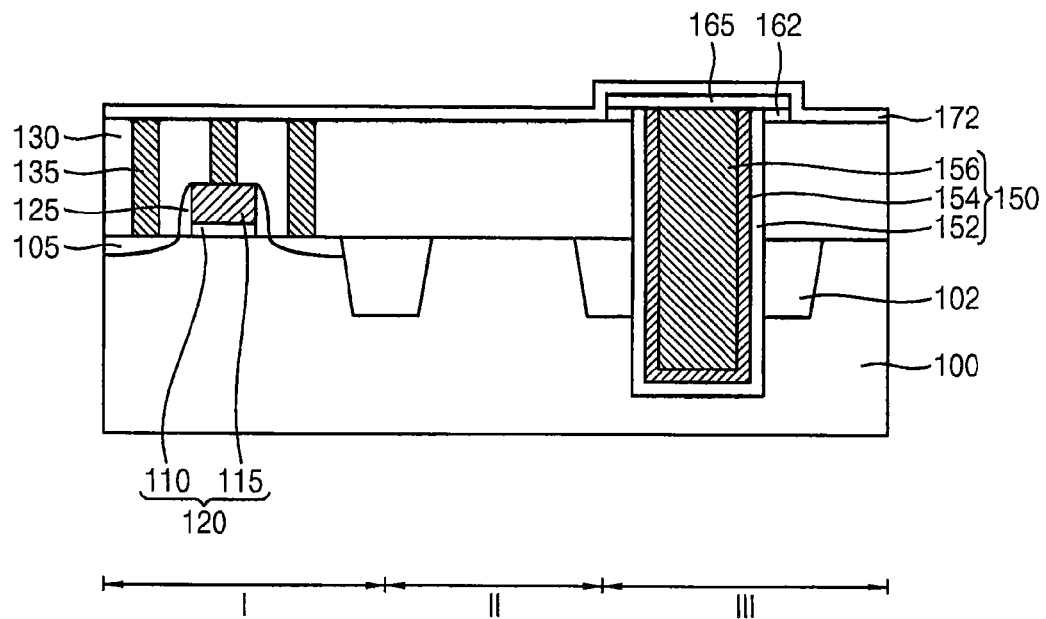

Referring to FIG. 18, a passivation layer 172 covering the contact plug 135 and the blocking layer pattern 165 may be formed on the first insulating interlayer 130. In some example embodiments, the passivation layer 172 may be formed from a nitride-based material, such as silicon nitride, using, for example, a CVD process or an ALD process.

Figure 19:
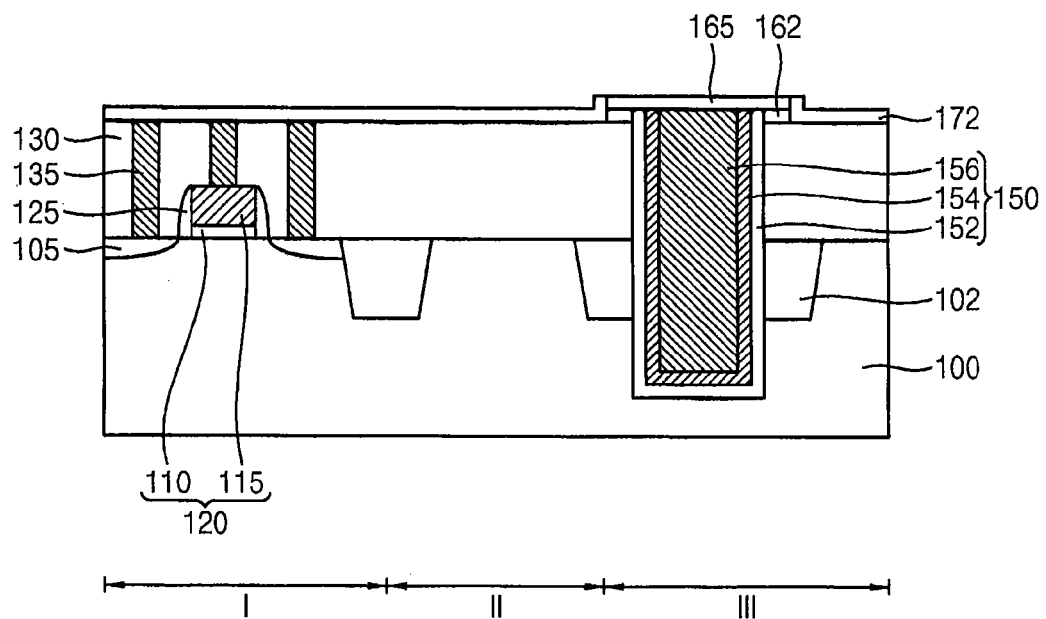

Referring to FIG. 19, an upper portion of the passivation layer 172 may be planarized by a CMP process such that a top surface of the blocking layer pattern 165 may be exposed again. The Contact plug 135 may be covered by the passivation layer 172 on the first region I, and the through electrode 156 may be covered by the blocking layer pattern 165 on the third region III.

In some embodiments, the planarization process as illustrated with reference to FIG. 19 may be omitted. In this case, the through electrode 156 may be covered by a double-layered structure including the blocking layer pattern 165 and the passivation layer. In some embodiments, the passivation layer and the blocking layer pattern 165 may include substantially the same nitride-based material, and may be integral or merged with one another.

Figure 20:
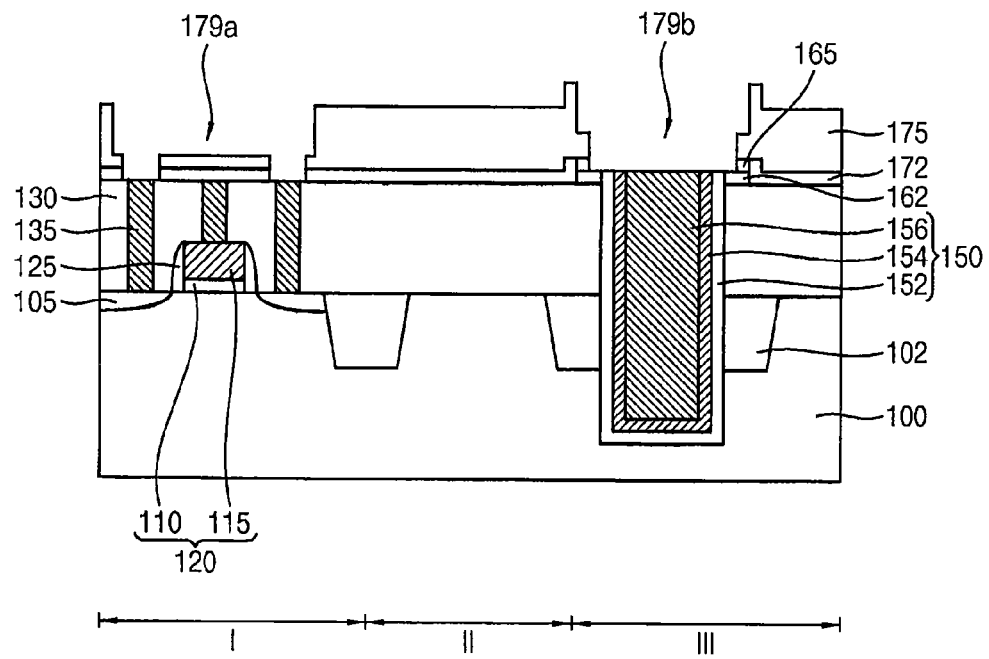

Referring to FIG. 20, processes substantially the same as or similar to those illustrated with reference to FIGS. 13 and 14A may be performed. A second insulating interlayer 175 may be formed on the passivation layer 172. The second insulating interlayer 175 may be partially removed to form a first opening 179a and a second opening 179b through which the contact plug 135 and the through electrode 156 are exposed, In some example embodiments, the first opening 179a may be formed through the second insulating interlayer 175 and the passivation layer 172 to expose the contact plug 135. The second opening 179b may be formed through the second insulating interlayer 175 and the blocking layer pattern 165 to expose an entire top surface of the through electrode structure 150.

While performing the etching process for the formation of the openings, the passivation layer 172 may cover the contact plug 135 on the first region I so that more uniform etching of the first opening 179a and the second opening 179b may be achieved. Thus, a pre-exposure and an etching damage of the contact plug 135 may be prevented during the etching process for the first and second openings 179a and 179b.

In some embodiments, if the planarization process illustrated in FIG. 19 is omitted, the second opening 179b may extend through the second insulating interlayer 175, the passivation layer 172 and the blocking layer pattern 165 to expose the through electrode 156 as illustrated in FIG. 16B.

In some embodiments, as illustrated in FIG. 14B, a top surface of the through electrode 156 may be partially exposed by the second opening.

Subsequently, a process substantially the same as or similar to that illustrated with reference to FIG. 15A may be performed to form a wiring structure 182 and an interconnection structure 184a in the first opening 179a and the second opening 179, respectively. In this manner, the semiconductor device of FIG. 16A may be obtained. In some embodiments, before the formation of the wiring structure 182 and the interconnection structure 184a, a first barrier layer and a second barrier layer may be formed on inner walls of the first opening 179a and the second opening 179b.

The wiring structure 182 may be formed through the second insulating interlayer 175 and the passivation layer 172 to be in contact with the contact plug 135. The interconnection structure 184a may be formed through the second insulating interlayer 175 and the blocking layer pattern 165 to be in contact with the through electrode 156. The interconnection structure 184a may cover the top surface of the through electrode structure 150, and may be also in contact with the etch-stop layer pattern 162.

In some embodiments, if the planarization process illustrated in FIG. 19 is omitted, the interconnection structure 184a may extend through the second insulating interlayer 175, the passivation layer 172 and the blocking layer pattern 165 to be in contact with the through electrode 156 as illustrated in FIG. 16B. In some embodiments, the interconnection structure may partially contact the top surface of the through electrode 156 as illustrated in FIG. 1B.

Figure 21:
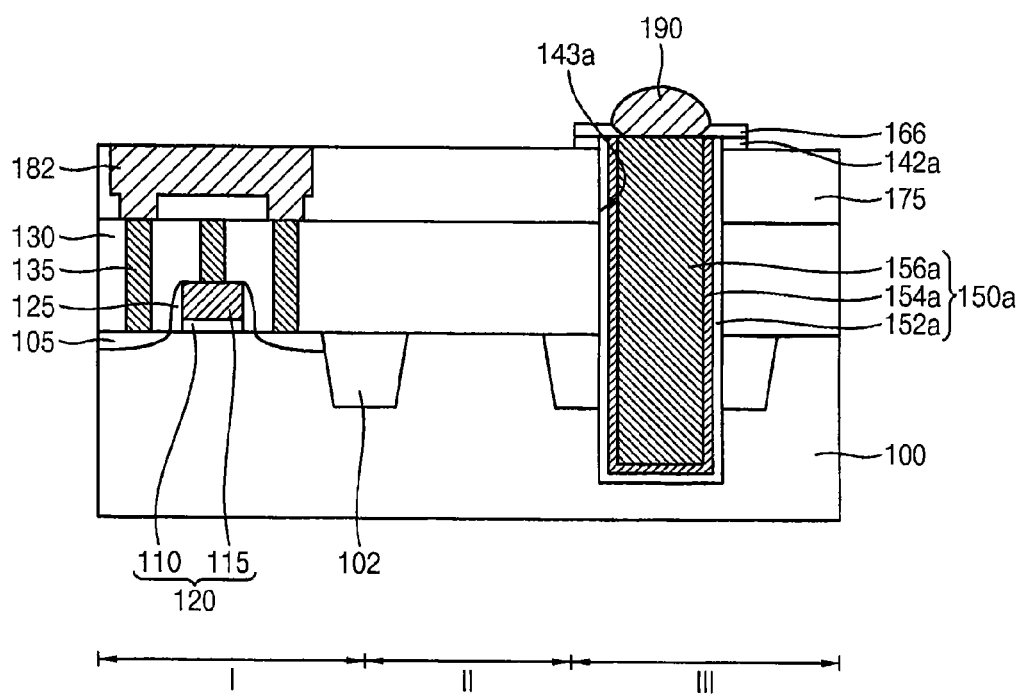

FIG. 21 is a cross-sectional view illustrating a semiconductor device in accordance with some example embodiments. For example, the semiconductor device may have a via-last structure in which a through electrode structure may be formed after forming a circuit device and a wiring structure. Detailed descriptions on elements and/or constructions substantially the same as or similar to those illustrated with reference to FIGS. 1A and 1B are omitted in light of the foregoing descriptions. Like reference numerals are used to designate like elements.

Referring to FIG. 21, the semiconductor device may include the circuit device formed on a first region I of a substrate 100 and including a gate structure 120 and an impurity region 105, a first insulating interlayer 130 formed of the substrate 100 and covering the circuit device, a contact plug 135 extending through the first insulating interlayer 130 and contacting the impurity region 105, a second insulating interlayer 175 formed on the first insulating interlayer 130, and a wiring structure 182 formed in the second insulating interlayer 175 and electrically connected to the contact plug 135.

In example embodiments, a through electrode structure 150a may extend through the second insulating interlayer 175 and the first insulating interlayer 130, and at least partially through the substrate 100. An upper portion of the through electrode structure 150a may protrude from a top surface of the second insulating interlayer 175. The through electrode structure 150a may include a via insulation layer pattern 152a, a barrier layer pattern 154a and a through electrode 156a sequentially stacked from an innerwall of a via hole 143a.

In example embodiments, an etch-stop layer pattern 142a may be formed on the top surface of the second insulating interlayer 175, and may have a ring shape surrounding a protrusion of the through electrode structure 150a. Top surfaces of the etch-stop layer pattern 142a and the through electrode structure 150a may be coplanar.

A blocking layer pattern 166 through which a top surface of the through electrode 156a may be exposed may be disposed on the etch-stop layer pattern 142a. The blocking layer pattern 166 may cover the etch-stop layer pattern 142a, and may include a hole through which the top surface of the through electrode structure 150a is partially exposed. Sidewalls of the etch-stop layer pattern 142a and the blocking layer pattern 166 may extend across substantially the same plane.

A conductive member 190 may be inserted in the hole of the blocking layer pattern 166 to contact the top surface of the through electrode 156a. For example, a semiconductor chip or a package substrate may be connected on the semiconductor device through the conductive member 190. The conductive member 190 may include a conductive bump or a solder ball formed of a metal, such as silver or copper.

FIGS. 22 to 25 are cross-sectional views illustrating operations for manufacturing a semiconductor device in accordance with further example embodiments. In particular, FIGS. 22 to 25 illustrate operations that may be used to manufacture the semiconductor device of FIG. 21. Detailed descriptions on processes and/or materials substantially the same as or similar to those illustrated with reference to FIGS. 2 to 15B are omitted in light of the foregoing descriptions.

Figure 22:
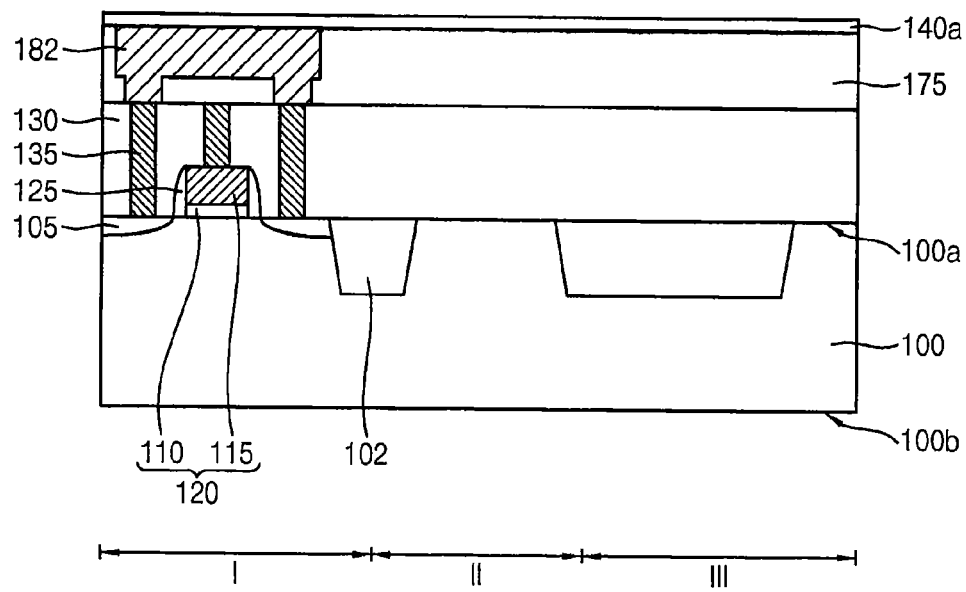

Referring to FIG. 22, processes substantially the same as or similar to those illustrated with reference to FIGS. 2 and 3 may be performed. A gate structure 120 including a gate insulation layer pattern 110 and a gate electrode 115, a gate spacer 125 and an impurity region 105 may be formed on a first surface 100a of a substrate 100. A first insulating interlayer 130 covering the gate structure 120 may be formed on the substrate 100, and a contact plug 135 may be formed through the first insulating interlayer 130 to be electrically connected to the impurity region 105 and/or the gate electrode 115.

A second insulating interlayer 175 covering the contact plug 135 may be formed on the first insulating interlayer 130. A wiring structure 182 extending through the second insulating interlayer 175 and electrically connected to the contact plug 135 may be formed by processes substantially the same as or similar to those illustrated with reference to FIGS. 14A and 15A. An etch-stop layer 140a covering the wiring structure 182 may be formed on the second insulating interlayer 175.

Figure 23:
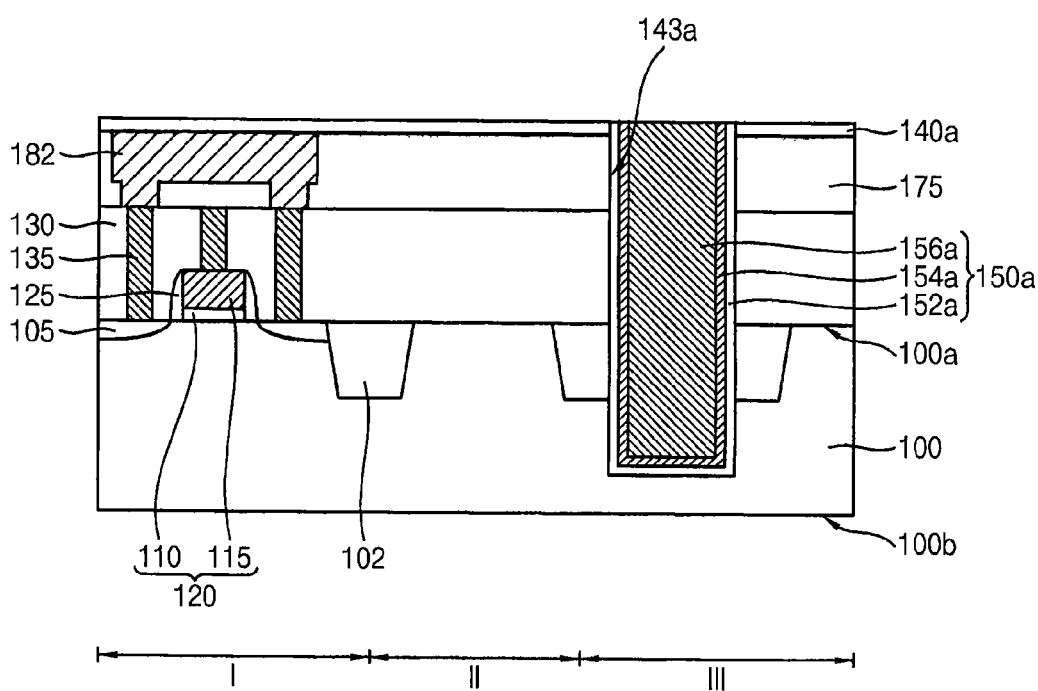

Referring to FIG. 23, processes substantially the same as or similar to those illustrated with reference to FIGS. 4 to 6 may be performed. As a result, a via hole 143a may be formed through the etch-stop layer 140a, the second insulating interlayer 175 and the first insulating interlayer 130, and at least partially through the substrate 100. A through electrode structure 150a including a via insulation layer pattern 152a, a barrier layer pattern 154a and a through electrode 156a sequentially stacked on an innerwall of the via hole 143a may be formed in the via hole 143a.

Figure 24:
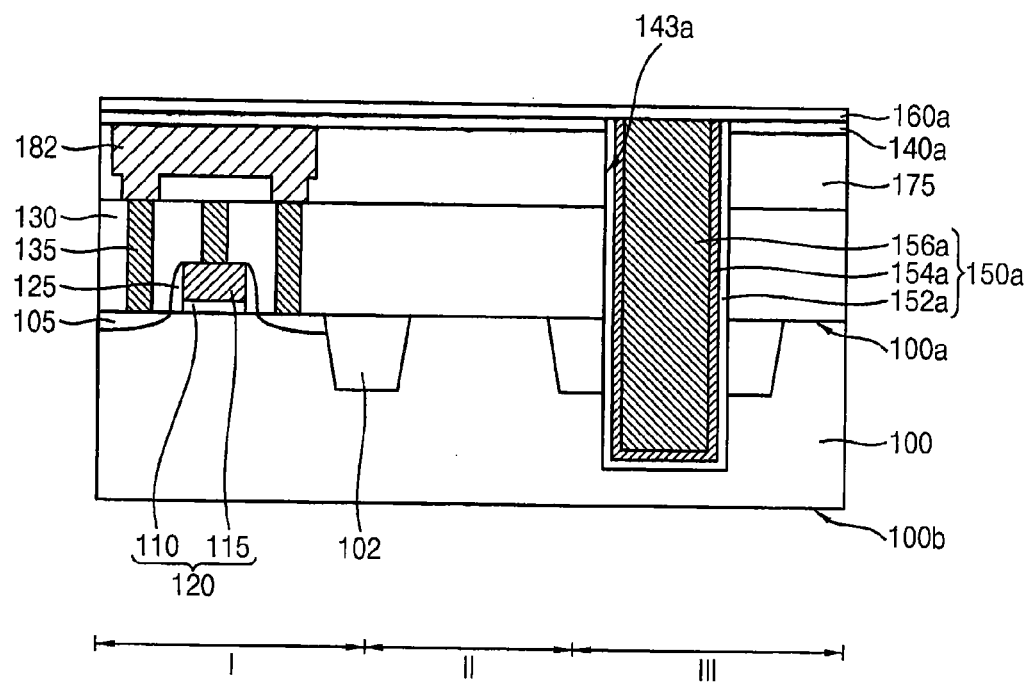

Referring to FIG. 24, a blocking layer 160a covering the through electrode structure 150a may be formed on the etch-stop layer 140a.

Figure 25:
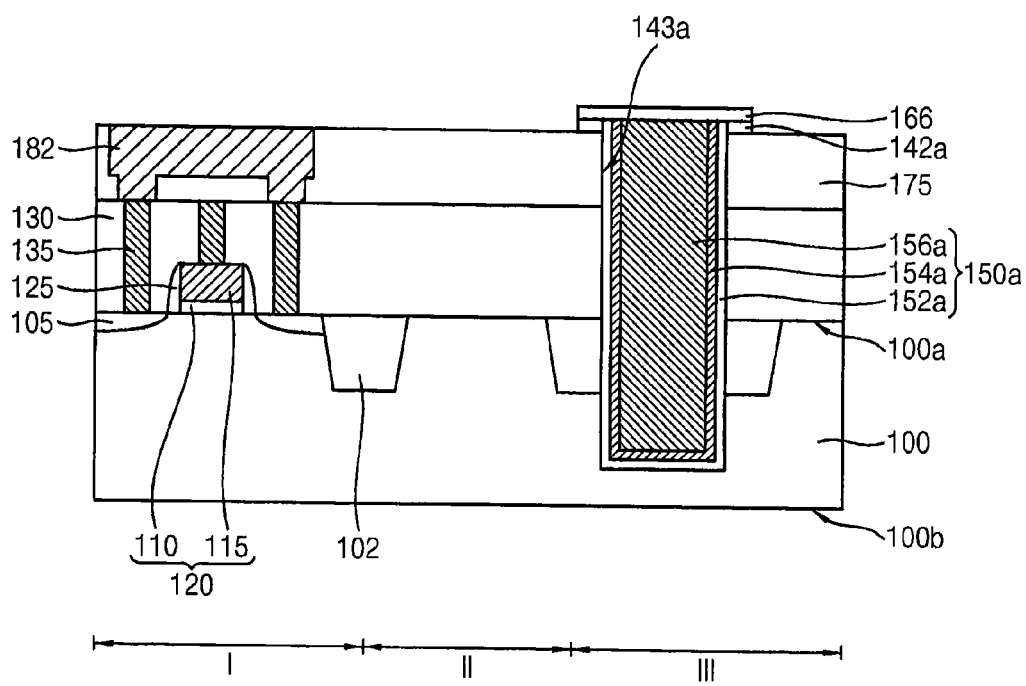

Referring to FIG. 25, processes substantially the same as or similar to those illustrated with reference to FIGS. 8 and 9 may be performed. As a result, the blocking layer 160a and the etch-stop layer 140a may be partially etched to form a blocking layer pattern 166 and an etch-stop layer pattern 142a. The blocking layer pattern 166 may have a circular or polygonal tile shape covering the through electrode structure 150a as illustrated in FIGS. 10 to 12. The etch-stop layer pattern 142a a circular or polygonal ring shape surrounding an upper portion of the through electrode structure 150a that may protrude from a top surface of the second insulating interlayer 175.

Referring again to FIG. 21, the blocking layer pattern 166 may be partially etched to form a hole through which a top surface of the through electrode 156a may be at least partially exposed. A conductive member 190 at least partially inserted in the hole may be formed on the blocking layer pattern 166 and the through electrode 156a. The conductive member 190 may be formed as a conductive bump or a solder ball.

According to some example embodiments described above, a blocking layer and a blocking layer pattern may be also implemented in the via-last structure, so that metal materials included in the wiring structure 182 and the through 156a may be prevented from being simultaneously exposed to contaminants, such as external air.

Figure 26:
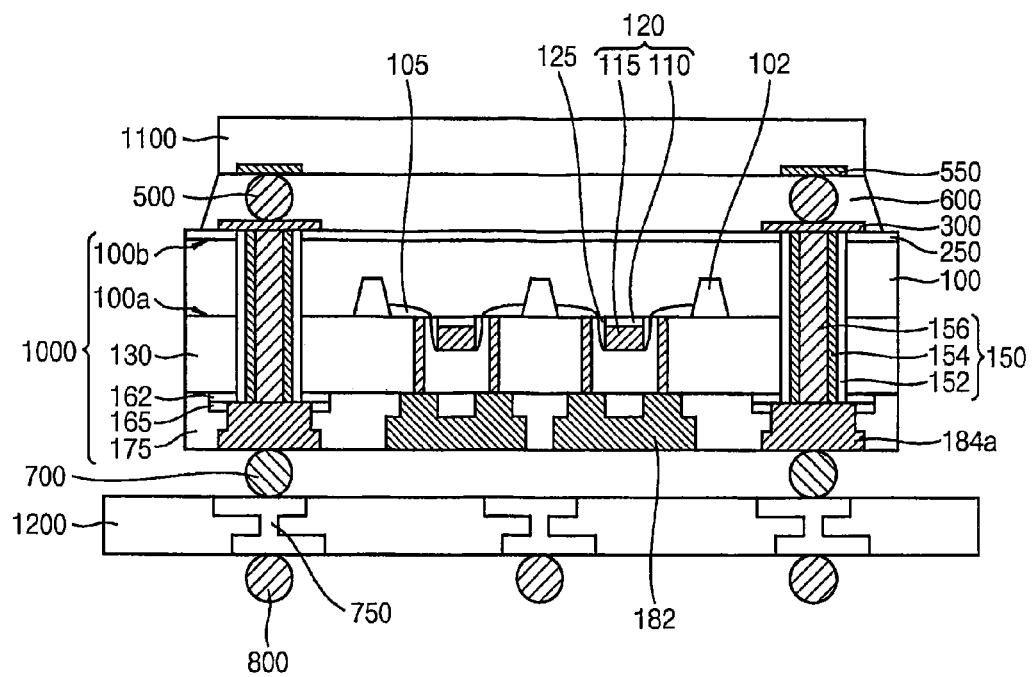

FIG. 26 is a cross-sectional view illustrating a semiconductor package in accordance with example embodiments. The semiconductor package may include the semiconductor devices illustrated with reference to FIGS. 1A and 1B, FIGS. 16A and 16B, or FIG. 21. Repeated descriptions of the semiconductor devices are omitted, and like reference numerals are used to designate like elements.

Referring to FIG. 26, the semiconductor package may include stacked semiconductor devices mounted on a package substrate 1200. The stacked semiconductor devices may include a first semiconductor device 1000 and a second semiconductor device 1100 stacked on the first semiconductor device 1000

The package substrate 1200 may be an insulation substrate including circuit patterns 750, such as a printed circuit board (PCB). An external connection terminal 800, such as a solder ball, may be disposed on a lower portion of the package substrate 1200. The semiconductor package may be mounted on a module substrate, a main board, a high density interconnection (HDI) substrate, etc., through the external connection terminal 800. In some embodiments, the package substrate 1200 may include an interposer substrate.

The first semiconductor device 1000 may be mounted on the package substrate 1200 via a first conductive bump 700. The first semiconductor device 1000 may have a structure and/or may include items substantially the same as or similar to those illustrated with reference to FIGS. 1A and 1B, FIGS. 16A and 16B, or FIG. 21.

A through electrode structure 150 may be exposed through a second surface 100*b* of a substrate 100. In some embodiments, the through electrode structure 150 may protrude from the second surface 100*b* of the substrate 100. A protection layer pattern 250 may be formed on a sidewall of a protrusion of the through electrode structure 150, and on the second surface 100*b* of the substrate 100. A first pad 300 may be disposed on the protection layer pattern 250 and on a top surface of the protrusion of the through electrode structure 150.

In some example embodiments, the first semiconductor device 1000 may be mounted on the package substrate 1200 such that a first surface 100*a* of the substrate 100 may face the package substrate 1200. The first conductive bump 700 may be interposed between the circuit pattern 750 and an interconnection structure 184*a*. As described above, the interconnection structure 184*a* may be formed through a blocking layer pattern 165 to be in contact with a through electrode 156. In some embodiments, an additional conductive structure, such as a bonding pad, may be further disposed between the first conductive bump 700 and the interconnection structure 184*a*.

In some embodiments, the first semiconductor device 100 may be a semiconductor chip including a logic device such as a central processing unit (CPU) or an application processor (AP).

The second semiconductor device 1100 may be mounted on the first semiconductor device 100 via a second conductive bump 500. For example, the second conductive bump 500 may be in contact with the first pad 300 and a second pad 550 included in the second semiconductor device 1100.

In some embodiments, the second semiconductor device 1100 may include a memory device such as DRAM, SRAM, flash memory devices, etc.

A molding member 600 may be formed between the first and second semiconductor devices 1000 and 1100 so that the second conductive bump 500 may be protected and the second semiconductor device 1100 may be fixed on the first semiconductor device 1000. The molding member 600 may include, for example, an epoxy molding compound (EMC).

FIG. 26 illustrates that the first surface 100*a* and the second surface 100*b* of the first semiconductor device 1000 face the package substrate 1200 and the second semiconductor device 1100, respectively. However, the construction of the semiconductor package may not be limited to such an arrangement. For example, the second semiconductor device 1100 may be mounted on the first surface 100*a* of the first semiconductor device 1000, and the package substrate 1200 may be mounted to be adjacent to the second surface 100*b* of the first semiconductor device 1000

FIGS. 27 to 30 are cross-sectional views illustrating operations for manufacturing a semiconductor package in accordance with example embodiments. Detailed descriptions on processes substantially the same as or similar to those illustrated with reference to FIGS. 2 to 15B, FIGS. 17 to 20, or FIGS. 22 to 25 are omitted in light of the foregoing descriptions thereof.

Figure 27:
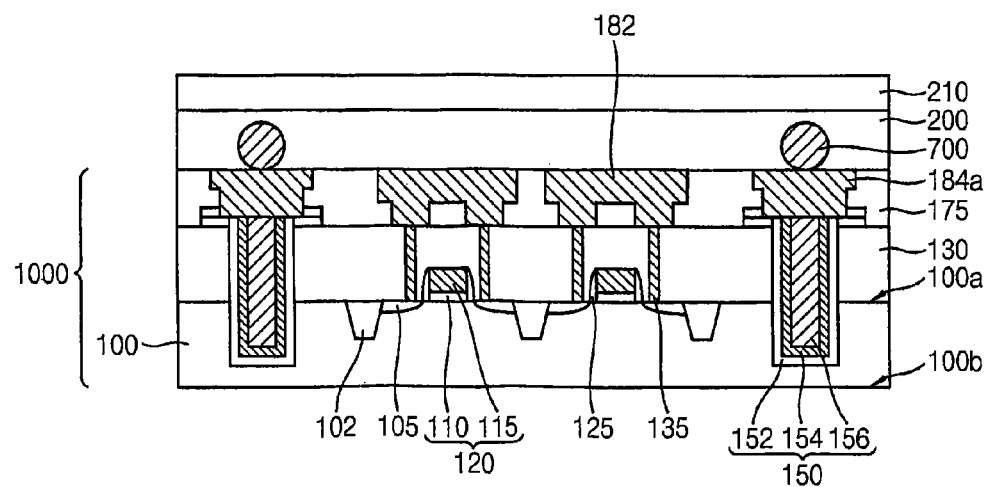

Referring to FIG. 27, processes substantially the same as or similar to those illustrated with reference to, e.g., FIGS. 2 to 15B may be performed to obtain a first semiconductor device 1000. A first conductive bump 700 may be formed over a first surface 100*a* of the first semiconductor device 1000 to be electrically connected to an interconnection structure 184*a*. An adhesion layer 200 covering a wiring structure 182, the interconnection structure 184*a* and the first conductive bump 700 may be formed on a second insulating interlayer 175. A carrier substrate 210 may be formed on the adhesion layer 200.

The first conductive bump 700 may be formed of a metal having a high electrical conductivity, such as silver or copper, or an alloy, such as a solder, formed by, for example, a printing process. A glass substrate may be used as the carrier substrate 210, however, a material of the carrier substrate 210 is not specifically limited thereto.

Figure 28:
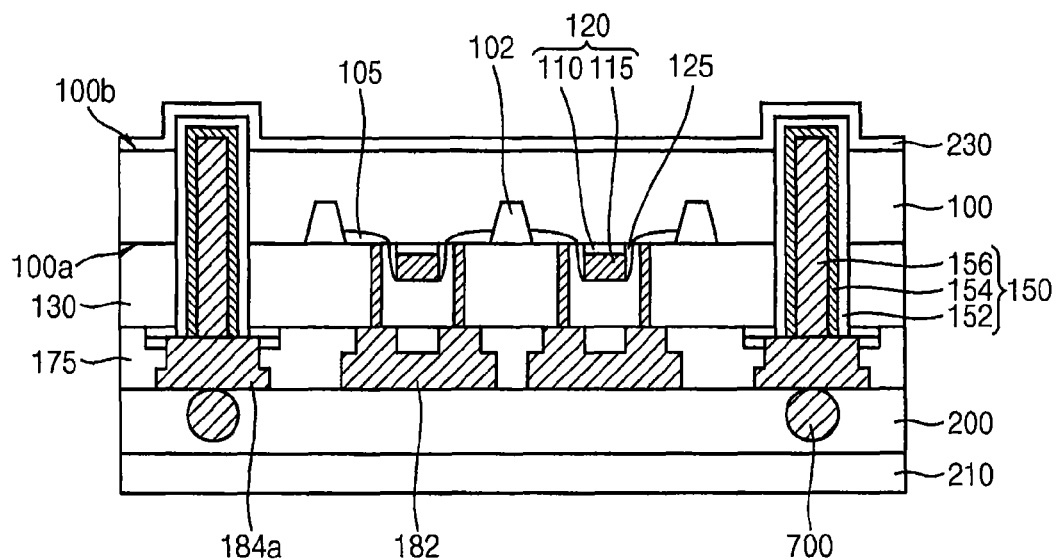

Referring to FIG. 28, the first semiconductor device 1000 may be flipped using the carrier substrate 210 such that a second surface 100*b* of the substrate 100 may be located upwardly. A portion of the substrate 100 adjacent to the second surface 100*b* may be polished so that a through electrode structure 150 may be partially exposed. Accordingly, a thickness of the substrate 100 may be reduced. A protection layer 230 may be formed on the second surface 100*b* of the substrate 100, and a surface of the through electrode structure 150 protruding from the second surface 100*b*. For example, the protection layer 230 may be formed of silicon nitride.

Figure 29:
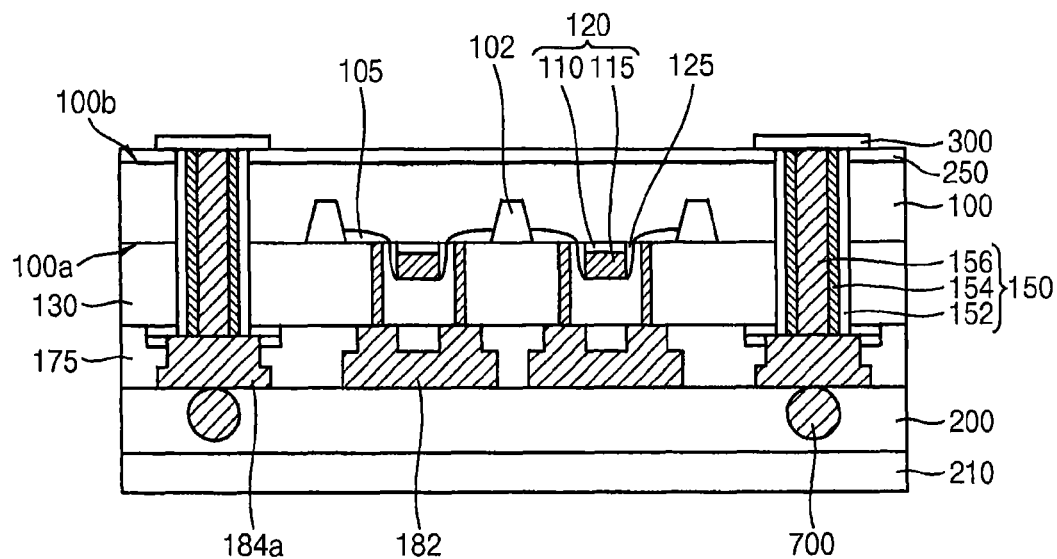

Referring to FIG. 29, a portion of the through electrode structure 150 protruding from the second surface 100*b* and an upper portion of the protection layer 230 may be polished by a CMP process to form a protection layer pattern 250.

A through electrode 156 may be exposed after performing the CMP process. A barrier layer pattern 154 and a via insulation layer pattern 152 may be converted into a sleeve-like shape surrounding the through electrode 156. The protection layer pattern 250 may laterally surround an exposed portion of the through electrode structure 150. A first pad 300 may be formed on the protection layer pattern 250 and an exposed surface of the through electrode structure 150. The first pad 300 may be formed using a conductive material such as a metal.

Figure 30:
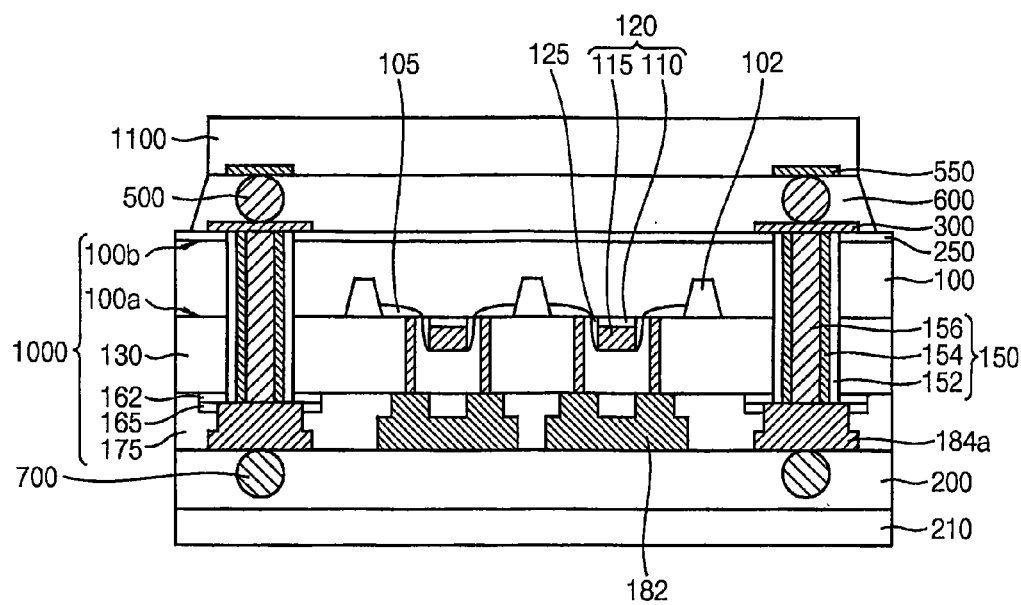

Referring to FIG. 30, a second conductive bump 500 may be formed on the first pad 300, and a second semiconductor device 1100 may be mounted on the first pad 300. The second conductive bump 500 may be formed of a material substantially the same as or similar to that of the first conductive bump 700. A second pad 550 included in the second semiconductor device 1100 may be aligned with the second conductive bump 500, and the second semiconductor device 1100 and the first semiconductor device 1000 may be connected to each other using, for example, a reflow process.

A molding member 600 covering the first pad 300, the second pad 550 and the second conductive bump 500 may be formed between the first and second semiconductor devices 1000 and 1100. The molding member 600 may be formed using an adhesive and insulation material, such as EMC.

The adhesion layer 200 and the carrier substrate 210 may be removed so that the first conductive bump 700 may be exposed. The first semiconductor device 1000 on which the second semiconductor device 1100 is mounted may be mounted on a package substrate 1200 to obtain the semiconductor package illustrated in FIG. 26. The first conductive bump 700 may be aligned with a circuit pattern 750 of the package substrate 1200, and a stacked semiconductor chip including the first and second semiconductor devices 1000 and 1100 may be mounted on the package substrate 1200 using, for example, a reflow process.

Figure 31:
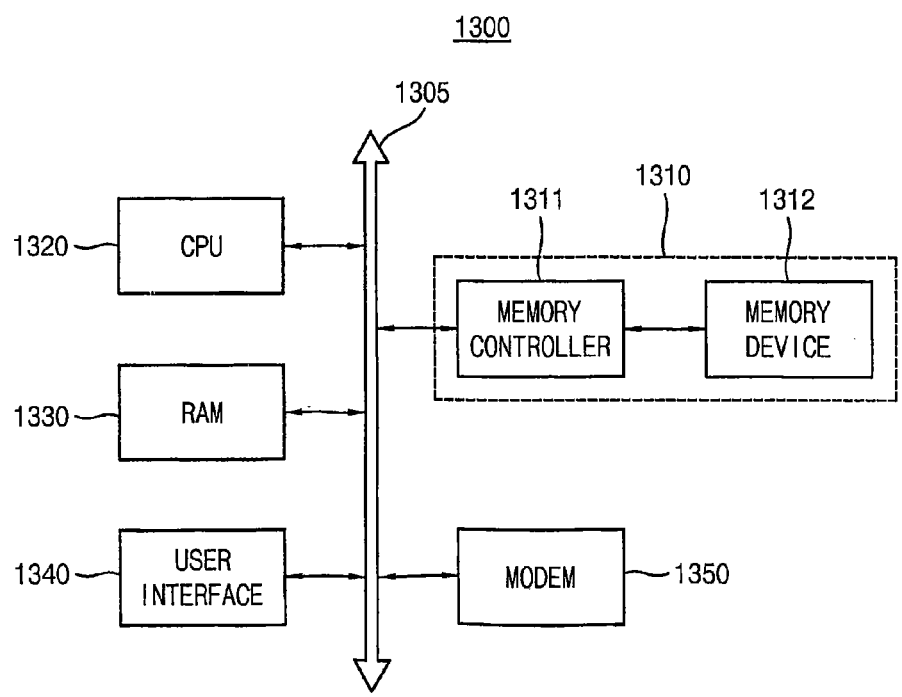

FIG. 31 is a block diagram illustrating a schematic construction of an information processing system in accordance with example embodiments.

Referring to FIG. 31, an information system 1300 may be implemented into a mobile device or a computer. The information processing system 1300 may include a CPU 1320, a RAM 1330, a user interface 1340, a modem 1350 such as a baseband chipset and a memory system 1310 electrically connected to a system bus 305. The memory system 1310 may include a memory device 1312 and a memory controller 1311. The memory device 1312 may include the semiconductor device or the semiconductor package in accordance with example embodiments described above. The memory controller 1311 may have a construction capable of controlling the memory device 1312. The memory system 1310 may be provided as, e.g., a memory card or a solid state disk (SSD) by a combination of the memory device 1312 and the memory controller 1311. In some embodiments, the memory device 1312 and the memory controller 1311 may be provided as the semiconductor package in accordance with example embodiments described above.

According to some example embodiments of the present inventive concepts, a through electrode structure extending through an insulating interlayer and a substrate may be formed, and then a blocking layer pattern covering a top surface of the through electrode structure may be formed. Accordingly, exposure of the through electrode structure may be prevented while performing a subsequent pretreatment for a BEOL or other process. This may reduce generation of a metal by-product caused by a simultaneous exposure of first and second metals included in a contact plug and the through electrode structure, respectively. In addition, the blocking layer pattern may buffer or absorb stress from the through electrode structure. This may allow a circuit device to positioned closer to the through electrode structure so that a size or a dimension of the semiconductor device may be reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of fabricating a semiconductor device, the method comprising:
    forming a circuit device on a substrate;
    forming a first insulating interlayer on the substrate and covering the circuit device;
    forming a contact plug passing at least partially through the first insulating interlayer to be electrically connected to the circuit device;
    forming an etch-stop layer on the first insulating interlayer;
    forming a through electrode structure extending through the etch-stop layer and the first insulating interlayer and at least partially through the substrate;
    forming a blocking layer on the etch-stop layer and covering the through electrode structure; and
    removing portions of the blocking layer and the etch-stop layer to form an etch-stop layer pattern on the first insulating layer and a blocking layer pattern on the etch-stop layer pattern, the etch-stop layer pattern surrounding a portion of the through electrode structure, the blocking layer pattern on the etch-stop layer pattern and covering the through electrode structure;
    forming a second insulating interlayer on the first insulating interlayer and covering the etch-stop layer pattern and the blocking layer pattern;
    removing portions of the second insulating interlayer and the blocking layer pattern to form first and second openings exposing the contact plug and the through electrode structure, respectively; and
    forming a wiring structure and an interconnection structure in respective ones of the first opening and the second opening and electrically connected to respective ones of the contact plug and the through electrode structure, wherein the blocking layer pattern is converted into a ring surrounding a portion of the interconnection structure.

2. The method of claim 1, wherein the etch-stop layer pattern has a circular ring shape or a polygonal ring shape, and the blocking layer pattern has a circular tile shape or a polygonal tile shape.

3. The method of claim 1, wherein the contact plug is formed of a metal different from that of the through electrode structure.

4. The method of claim 3, wherein the contact plug is formed of tungsten (W) and the through electrode structure is formed of copper (Cu).

5. The method of claim 1, wherein a top surface of the contact plug is exposed by removing the portions of the blocking layer and the etch-stop layer.

6. The method of claim 1, wherein forming the first and second openings includes a double damascene process.

7. The method of claim 1, further comprising forming a passivation layer on the first insulating interlayer to cover the contact plug and the blocking layer pattern before forming the second insulating interlayer.

8. The method of claim 7, further comprising planarizing an upper portion of the passivation layer such that the blocking layer pattern is exposed.

9. The method of claim 8, wherein the first opening extends through the second insulating interlayer and the passivation layer to expose the contact plug, and the second opening extends through the second insulating interlayer and the blocking layer pattern to expose the through electrode structure.

10. A method of fabricating a semiconductor device, the method comprising:
    forming a first insulating interlayer on a substrate;
    forming a contact plug passing at least partially through the first insulating Interlayer;

forming an etch-stop layer on the first insulating interlayer;

forming an electrode extending through the etch-stop layer and the first insulating interlayer and at least partially through the substrate;

forming a blocking layer on the etch-stop layer and covering the electrode; and removing portions of the blocking layer and the etch-stop layer to form an etch-stop layer pattern on the first insulating interlayer and covering a sidewall surface of a portion of the electrode protruding from the first insulating interlayer and a blocking layer pattern on the etch-stop layer and covering a top surface of the electrode;

forming a second insulating interlayer on the first insulating interlayer and covering the etch-stop layer pattern and the blocking layer pattern;

removing portions of the second insulating interlayer and the blocking layer pattern to form first and second openings exposing the contact plug and the electrode, respectively; and forming a wiring structure and an interconnection structure in respective ones of the first opening and the second opening and electrically connected to respective ones of the contact plug and the electrode, wherein the blocking layer pattern is converted into a ring surrounding a portion of the interconnection structure.

11. The method of claim 10, wherein forming the etch-stop layer on the insulating interlayer is preceded by forming a conductive plug in the insulating interlayer, wherein the conductive plug and the electrode comprise dissimilar metals.

12. The method of claim 10, further comprising:

forming an upper insulating interlayer on the insulating interlayer and covering the blocking layer pattern;

removing portions of the upper insulating interlayer and the blocking layer pattern to form a hole exposing the top surface of the electrode; and forming a conductive via in the hole.

13. The method of claim 12, wherein the hole exposes a top surface of the etch-stop layer pattern, and wherein the conductive via is wider than the electrode.

14. The method of claim 12, wherein the hole exposes only a portion of the top surface of the electrode, and wherein the conductive via is narrower than the electrode.

15. A method of fabricating a semiconductor device, the method comprising:

providing a substrate;

forming an isolation layer in the substrate to define a device region, a buffer region and a via region;

forming a circuit device on the device region of the substrate;

forming a first insulating interlayer covering the circuit device throughout the device region, the buffer region and the via region;

forming a contact plug passing at least partially through the first insulating interlayer;

forming an etch-stop layer on the a first insulating interlayer throughout the device region, the buffer region and the via region;

forming an electrode extending through the etch-stop layer and the first insulating interlayer and at least partially through the substrate on the via region;

forming a blocking layer on the etch-stop layer and covering the electrode throughout the device region, the buffer region and the via region; and removing portions of the blocking layer and the etch-stop layer to form a blocking layer pattern covering the electrode and an etch-stop layer pattern surrounding a sidewall of an upper portion of the electrode on the via region;

forming a second insulating interlayer on the first insulating interlayer and covering the etch-stop layer pattern and the blocking layer pattern;

removing portions of the second insulating interlayer and the blocking layer pattern to form first and second openings exposing the contact plug and the electrode, respectively; and forming a wiring structure and an interconnection structure in respective ones of the first opening and the second opening and electrically connected to respective ones of the contact plug and the electrode, wherein the blocking layer pattern is converted into a ring surrounding a portion of the interconnection structure.

16. The method of claim 15, wherein removing the portions of the blocking layer and the etch-stop layer includes forming a photoresist pattern on a portion of the blocking layer on the via region.

17. The method of claim 15, wherein the buffer region has an area or a volume smaller than that of each of the device region and the via region.

* * * * *